(12) United States Patent
Fukuhara et al.

(10) Patent No.: US 7,330,598 B2
(45) Date of Patent: Feb. 12, 2008

(54) IMAGE ENCODING APPARATUS AND METHOD

(75) Inventors: Takahiro Fukuhara, Kanagawa (JP); Kazuhisa Hosaka, Tokyo (JP)

(73) Assignee: Sony Corporation, Tokyo (JP)

( * ) Notice: Subject to any disclaimer, the term of this patent is extended or adjusted under 35 U.S.C. 154(b) by 691 days.

(21) Appl. No.: 10/933,274

(22) Filed: Sep. 3, 2004

(65) Prior Publication Data
US 2005/0084168 A1   Apr. 21, 2005

(30) Foreign Application Priority Data
Sep. 8, 2003   (JP)   ............... P2003-316092
Oct. 28, 2003   (JP)   ............... P2003-367809

(51) Int. Cl.
*G06K 9/36* (2006.01)
(52) U.S. Cl. ..................................... 382/240
(58) Field of Classification Search ................ 382/232, 382/240, 247, 248; 348/384.1, 395.1, 398.1, 348/399.1, 407.1, 420.1; 375/240, 240.11, 375/240.18, 240.19, 240.24
See application file for complete search history.

(56) References Cited

U.S. PATENT DOCUMENTS 5,748,786 A * 5/1998 Zandi et al. ............... 382/240
6,222,941 B1 * 4/2001 Zandi et al. ............... 382/232
6,466,698 B1 * 10/2002 Creusere ................... 382/240
2003/0198391 A1 10/2003 Fukuhara et al.
2004/0141652 A1 7/2004 Fukuhara et al.

* cited by examiner

*Primary Examiner*—Jose L. Couso
(74) *Attorney, Agent, or Firm*—Oblon, Spivak, McClelland, Maier & Neustadt, P.C.

(57) ABSTRACT

It is aimed at decreasing process load for arithmetic coding and effectively providing rate control by suppressing image quality degradation. In an image encoding apparatus 1, a code amount adding section 18 accumulates code amounts of arithmetic codes D17 for each bit plane encoded in an EBCOT section 17 and supplies an accumulated value to a control section 19. The control section 19 compares this accumulated value with a targeted code amount. When the accumulated value does not reach the targeted code amount, the control section 19 transmits a control signal D19 to the EBCOT section 17 to encode the next bit plane. When the accumulated value reaches the targeted code amount, the code amount adding section 18 supplies an encoded code stream D20 after completion of the code amount control to a header generation section 20 and a packet generation section 21. At this time, the EBCOT section 17 encodes a quantization coefficient D15 for each bit plane by traversing all code blocks from a bit plane having the highest bit position to a bit plane having the lowest bit position in order.

24 Claims, 23 Drawing Sheets

| Level | Y | | | | Cb | | | | Cr | | | |
|---|---|---|---|---|---|---|---|---|---|---|---|---|
| | LL | HL | LH | HH | LL | HL | LH | HH | LL | HL | LH | HH |
| 0 | 1.000 | | | | 1.000 | | | | 1.000 | | | |
| 1 | | 1.000 | 1.000 | 1.000 | | 0.813 | 0.813 | 0.738 | | 0.856 | 0.856 | 0.797 |
| 2 | | 1.000 | 1.000 | 1.000 | | 0.680 | 0.680 | 0.567 | | 0.750 | 0.750 | 0.656 |
| 3 | | 0.999 | 0.999 | 0.999 | | 0.489 | 0.489 | 0.349 | | 0.587 | 0.587 | 0.458 |
| 4 | | 0.838 | 0.838 | 0.702 | | 0.267 | 0.267 | 0.142 | | 0.375 | 0.375 | 0.236 |
| 5 | | 0.276 | 0.276 | 0.091 | | 0.090 | 0.090 | 0.090 | | 0.167 | 0.167 | 0.070 |

FIG.25

IMAGE ENCODING APPARATUS AND METHOD

BACKGROUND OF THE INVENTION

1. Field of the Invention

The present invention relates to an image encoding apparatus and its method such as JPEG-2000 to compress images by means of wavelet transform and entropy coding.

This application claims priority of Japanese Patent Application No. 2003-316092, filed on Sep. 8, 2003 and Japanese Patent Application No. 2003-367809, filed on Oct. 28,2003, the entireties of which are incorporated by reference herein.

2. Description of the Related Art

Conventionally, representative image compression techniques include JPEG (Joint Photographic Experts Group) standardized by ISO (International Standards Organization). It is known that the JPEG technique uses Discrete Cosine Transform (DCT) and provides excellent encoded and decoded images if relatively high bits are assigned. However, if the number of encoding bits is decreased to an excess, DCT specific block distortion becomes remarkable and subjective deterioration becomes conspicuous.

In recent years, extensive research is carried out on techniques that divide an image into a plurality of bands using a filter bank, i.e., a combination of a high-pass filter and a low-pass filter, and encode each of bands. Among these techniques, a special attention is paid to wavelet transform coding as a new technology that takes the place of DCT. The wavelet transform coding is free from a DCT drawback that causes remarkable block distortion in high compression.

The JPEG-2000 technique completed international standardization on January 2001. JPEG-2000 combines the wavelet transform with highly efficient entropy coding (bit-plane based bit modeling and arithmetic coding). JPEG-2000 more greatly improves coding efficiency than JPEG.

The international standards specify only decoder standards and permit design freedom to encoders. By contrast, there is no standard as to efficient rate control techniques to realize targeted compressibility ratios. The greatest importance is attached to establishment of know-how. JPEG makes the rate control especially difficult It has often been necessary to perform coding more than once until a targeted value is reached. However, this causes an increase in the processing time. JPEG-2000 is expected to obtain a targeted code amount through one-time encoding.

Generally, JPEG-2000 employs the rate control technique using RD (Rate-Distortion) characteristics. This rate control technique excels in versatility but has a drawback of causing very high calculation load.

As described in patent document 1 (Jpn. Pat. Appln. Laid-Open Publication No. 2002-165098) shown below, the applicants propose the technology of providing rate control by truncating a generated encoded code stream from the end. This technology enables control accurately adjusted to a targeted code amount.

However, the technology in patent document 1 may degrade the image quality by eliminating a code block from the end of an encoded code stream if the code block has a great influence on the image quality. It is expected to provide a more efficient rate control technique.

Generally, JPEG-2000 has no standard as to techniques of decreasing highly loaded entropy coding. The greatest importance is attached to establishment of know-how.

SUMMARY OF THE INVENTION

The present invention has been made in consideration of the foregoing. It is therefore an object of the present invention to provide an image encoding apparatus and its method of decreasing processing load on arithmetic encoding and effectively providing rate control by minimizing image quality degradation on a JPEG-2000 image encoding apparatus, for example.

To achieve the above-mentioned objects, an image encoding apparatus according to the present invention comprises: a filtering means for hierarchically applying a filtering process to an input image to generate a plurality of subbands; code block generation means for dividing the subbands generated by the filtering means to generate a plurality of code blocks each having a specified size; a bit plane generation means for generating a plurality of bit planes from the highest bit to the lowest bit in units of the code blocks; a bit modeling means for applying bit modeling to the plurality of bit planes generated by the bit plane generation means so as to traverse all code blocks from a bit plane having the highest bit position to a bit plane having the lowest bit position; a coding pass generation means for generating a coding pass for each bit plane where the bit modeling is performed; an encoding means for arithmetically encoding the coding pass generated by the coding pass generation means; a code amount control means for controlling code amounts so as to reach a specified targeted code amount based on an arithmetic code generated by the encoding means; and a packet generation means for generating a packet by attaching a header to an encoded code stream whose code amount is controlled by the code amount control means, wherein the code amount control means accumulates code amounts of arithmetic codes generated upon termination of arithmetic coding for each coding pass or a coding pass included in each bit plane and controls the encoding means so as to arithmetically encode the next coding pass when an accumulated value is smaller than or equal to the specified targeted code amount or so as to stop arithmetic coding when the accumulated value exceeds the specified targeted code amount.

To achieve the above-mentioned objects, an image encoding method according to the present invention comprises: a filtering step of hierarchically applying a filtering process to an input image to generate a plurality of subbands; a code block generation step of dividing subbands generated by the filtering step to generate a plurality of code blocks each having a specified size; a bit plane generation step of generating a plurality of bit planes from the highest bit to the lowest bit in units of the code blocks; a bit modeling step of applying bit modeling to the plurality of bit planes generated by the bit plane generation step so as to traverse all code blocks from a bit plane having the highest bit position to a bit plane having the lowest bit position; a coding pass generation step of generating a coding pass for each bit plane where the bit modeling is performed; an encoding step of arithmetically encoding the coding pass generated by the coding pass generation step; a code amount control step of controlling code amounts so as to reach a specified targeted code amount based on an arithmetic code generated by the encoding step; and a packet generation step of generating a packet by attaching a header to an encoded code stream whose code amount is controlled by the code amount control step, wherein the code amount control step accumulates code amounts of arithmetic codes generated upon termination of arithmetic coding for each coding pass or a coding pass included in each bit plane and controls the encoding step so as to arithmetically encode the next coding pass when an accumulated value is smaller than or equal to the specified targeted code amount or so as to stop arithmetic coding when the accumulated value exceeds the specified targeted code amount.

According to the image encoding apparatus and the method thereof, the coding pass is encoded in a specified sequence. The arithmetic code is generated each time the arithmetic coding terminates for the coding pass or a coding pass included in each bit plane. Code amounts of the arithmetic codes are accumulated. An accumulated value is compared to the specified targeted code amount The next coding pass is further encoded only when the accumulated value is smaller than the specified targeted code amount.

To achieve the above-mentioned objects, an image encoding apparatus according to the present invention comprises: a filtering means for hierarchically applying a filtering process to an input image to generate a plurality of subbands; a quantization means for quantizing a transform coefficient in a subband generated by the filtering means by dividing the transform coefficient by a quantization step size weighted by a weight coefficient specified for the subband; a code block generation means for dividing each of the quantized subbands to generate a plurality of code blocks each having a specified size; a bit plane generation means for generating a plurality of bit planes from the highest bit to the lowest bit in units of the code blocks; a bit modeling means for applying bit modeling to the plurality of bit planes generated by the bit plane generation means so as to traverse all code blocks from a bit plane having the highest bit position to a bit plane having the lowest bit position; a coding pass generation means for generating a coding pass for each bit plane where the bit modeling is performed; an encoding means for arithmetically encoding the coding pass generated by the coding pass generation means; a code amount control means for controlling code amounts so as to reach a specified targeted code amount based on an arithmetic code generated by the encoding means; and a packet generation means for generating a packet by attaching a header to an encoded code stream whose code amount is controlled by the code amount control means, wherein the code amount control means accumulates code amounts of arithmetic codes generated upon termination of arithmetic coding for each coding pass or a coding pass included in each bit plane and controls the encoding means so as to arithmetically encode the next coding pass when an accumulated value is smaller than or equal to the specified targeted code amount or so as to stop arithmetic coding when the accumulated value exceeds the specified targeted code amount.

To achieve the above-mentioned objects, an image encoding method according to the present invention comprises: a filtering step of hierarchically applying a filtering process to an input image to generate a plurality of subbands; a quantization step of quantizing a transform coefficient in a subband generated by the filtering step by dividing the transform coefficient by a quantization step size weighted by a weight coefficient specified for the subband; a code block generation step of dividing each of the quantized subbands to generate a plurality of code blocks each having a specified size; a bit plane generation step of generating a plurality of bit planes from the highest bit to the lowest bit in units of the code blocks; a bit modeling step of applying bit modeling to the plurality of bit planes generated by the bit plane generation step so as to traverse all code blocks from a bit plane having the highest bit position to a bit plane having the lowest bit position; a coding pass generation step of generating a coding pass for each bit plane where the bit modeling is performed; an encoding step of arithmetically encoding the coding pass generated by the coding pass generation step; a code amount control step of controlling code amounts so as to reach a specified targeted code amount based on an arithmetic code generated by the encoding step; and a packet generation step of generating a packet by attaching a header to an encoded code stream whose code amount is controlled by the code amount control step, wherein the code amount control step accumulates code amounts of arithmetic codes generated upon termination of arithmetic coding for each coding pass or a coding pass included in each bit plane and controls the encoding step so as to arithmetically encode the next coding pass when an accumulated value is smaller than or equal to the specified targeted code amount or so as to stop arithmetic coding when the accumulated value exceeds the specified targeted code amount.

According to the image encoding apparatus and the method thereof, the quantization step size is weighted using the weight coefficient specified for each subband to perform quantization. The coding pass is then encoded in a specified sequence. The arithmetic code is generated each time the arithmetic coding terminates for the coding pass or a coding pass included in each bit plane. Code amounts of the arithmetic codes are accumulated. An accumulated value is compared to the specified targeted code amount. The next coding pass is further encoded only when the accumulated value is smaller than the specified targeted code amount.

The image encoding apparatus and the method thereof according to the present invention encode the coding pass in a specified sequence. The arithmetic code is generated each time the arithmetic coding terminates for the coding pass or a coding pass included in each bit plane. Code amounts of the arithmetic codes are accumulated. An accumulated value is compared to the specified targeted code amount. The next coding pass is further encoded only when the accumulated value is smaller than the specified targeted code amount. Accordingly, it is possible to omit arithmetic coding for coding passes or bit planes that are finally truncated by the code amount control. This makes it possible to fast complete the encoding. The small calculation amount can realize energy saving. Further, bit modeling is applied to respective bit planes so as to traverse all code blocks from a bit plane having the highest bit position to a bit plane having the lowest bit position. The coding passes are arithmetically coded from a bit plane where the bit modeling is performed. An encoded code stream includes bit planes from those having significant effect on the image quality. Accordingly, the same code amount can maintain high image quality. In particular, the quantization uses the weight coefficient configured for each subband. For example, the quantization step size is weighted so that it decreases for a subband containing low-frequency components. In this manner, the image quality can be improved furthermore.

BRIEF DESCRIPTION OF THE DRAWINGS

FIGS. 5A-C illustrate bit planes, wherein FIG. 5A shows a quantization coefficient comprising 16 coefficients in total; FIG. 5B shows bit planes representing an absolute value of a coefficient; and FIG. 5C shows a bit plane representing codes;

FIG. 13 shows priorities of subbands when three components are available;

FIG. 14 shows priorities of subbands when three components are available;

FIG. 15 shows priorities of subbands when three components are available;

FIG. 25 shows an example of a weight coefficient table when weighting and quantization are performed for each subband.

DETAILED DESCRIPTION OF THE PREFERRED EMBODIMENTS

An embodiment of the present invention will be described in detail with reference to the accompanying drawings. The embodiment represents the present invention applied to an image encoding apparatus and its method for compressing and coding input images according to JPEG-2000. The following first describes the overall configuration and operations of the image encoding apparatus, and then major parts of the image encoding apparatus according to the present invention.

(1) Image Encoding Apparatus Configuration and Operations

Figure 1:
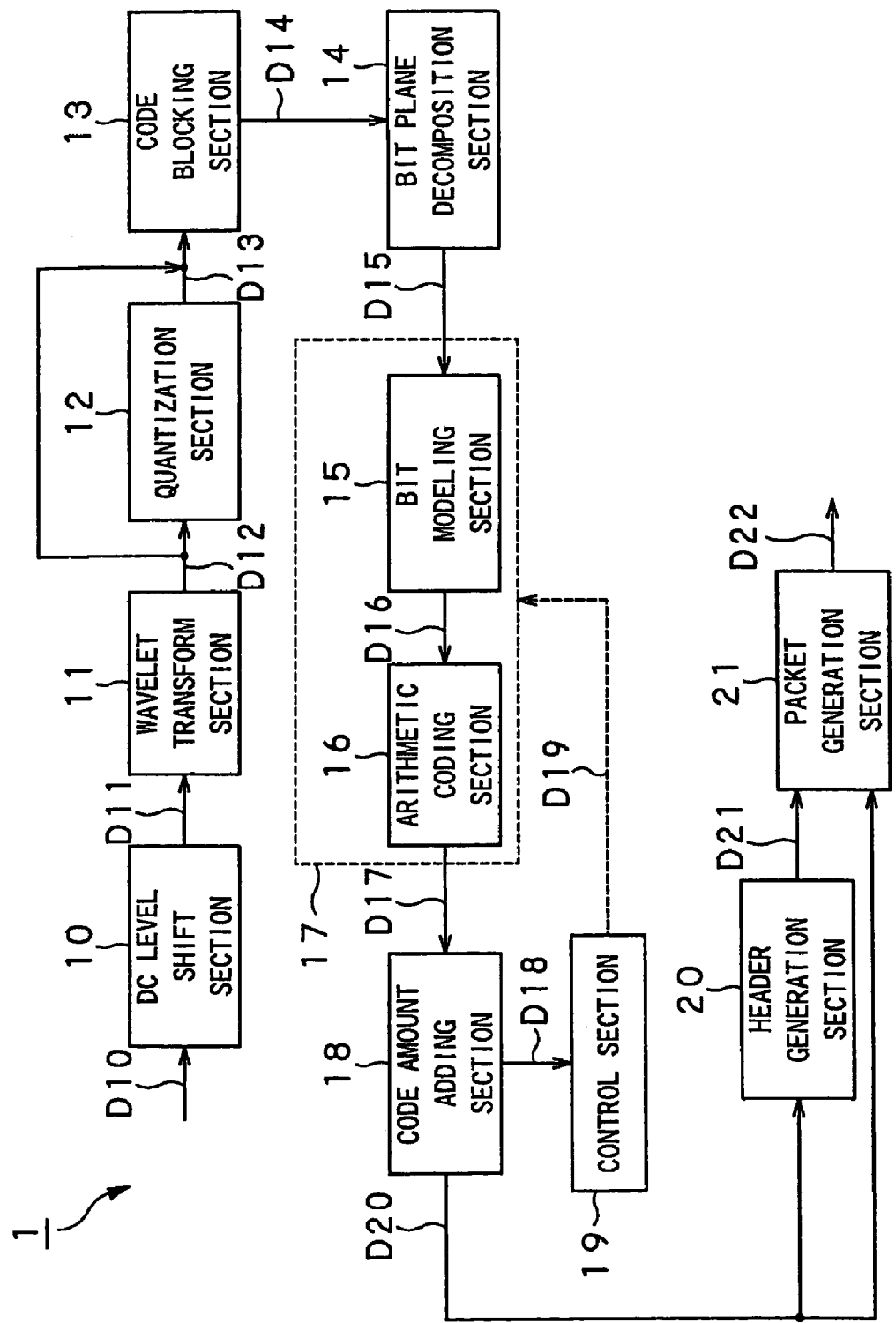
FIG. 1 schematically shows the configuration of an image encoding apparatus according to an embodiment of the present invention.

FIG. 1 schematically shows the configuration of the image encoding apparatus according to the embodiment of the present invention. As shown in FIG. 1, an image encoding apparatus 1 comprises: a DC level shift section 10; a wavelet transform section 11; a quantization section 12; a code blocking section 13; a bit plane decomposition section 14; a bit modeling section 15; an arithmetic coding section 16; a code amount adding section 18; a control section 19; a header generation section 20; and a packet generation section 21. The bit modeling section 15 and the arithmetic coding section 16 constitute an EBCOT (embedded Coding with Optimized Truncation) section 17.

The DC level shift section 10 performs a level shift of source signals so as to efficiently perform a wavelet transform in the succeeding wavelet transform section 11 and improve the compressibility ratio. In theory, an RGB signal has a positive value (unsigned integer). Consequently, it is possible to improve the compression efficiency by performing a level shift that halves a source signal's dynamic range. On the other hand, no level shift is performed for color difference signals such as Cb and Cr in a YCbCr signal since color difference signals have both positive and negative integer values.

The wavelet transform section 11 uses a filter bank comprising a high-pass filter and a low-pass filter. Generally, a digital filter has an impulse response (filter coefficient) using a plurality of tap lengths. It is necessary to buffer enough input images for filtering in advance. However, this is not illustrated in FIG. 1 for simplicity.

The DC level shift section 10 is supplied with a minimal image signal D10 needed for filtering and performs the level shift as mentioned above. The wavelet transform section 11 applies a filtering process for wavelet transform to an image signal D11 after the DC level shift to generate a wavelet transform coefficient D12.

Figure 2:
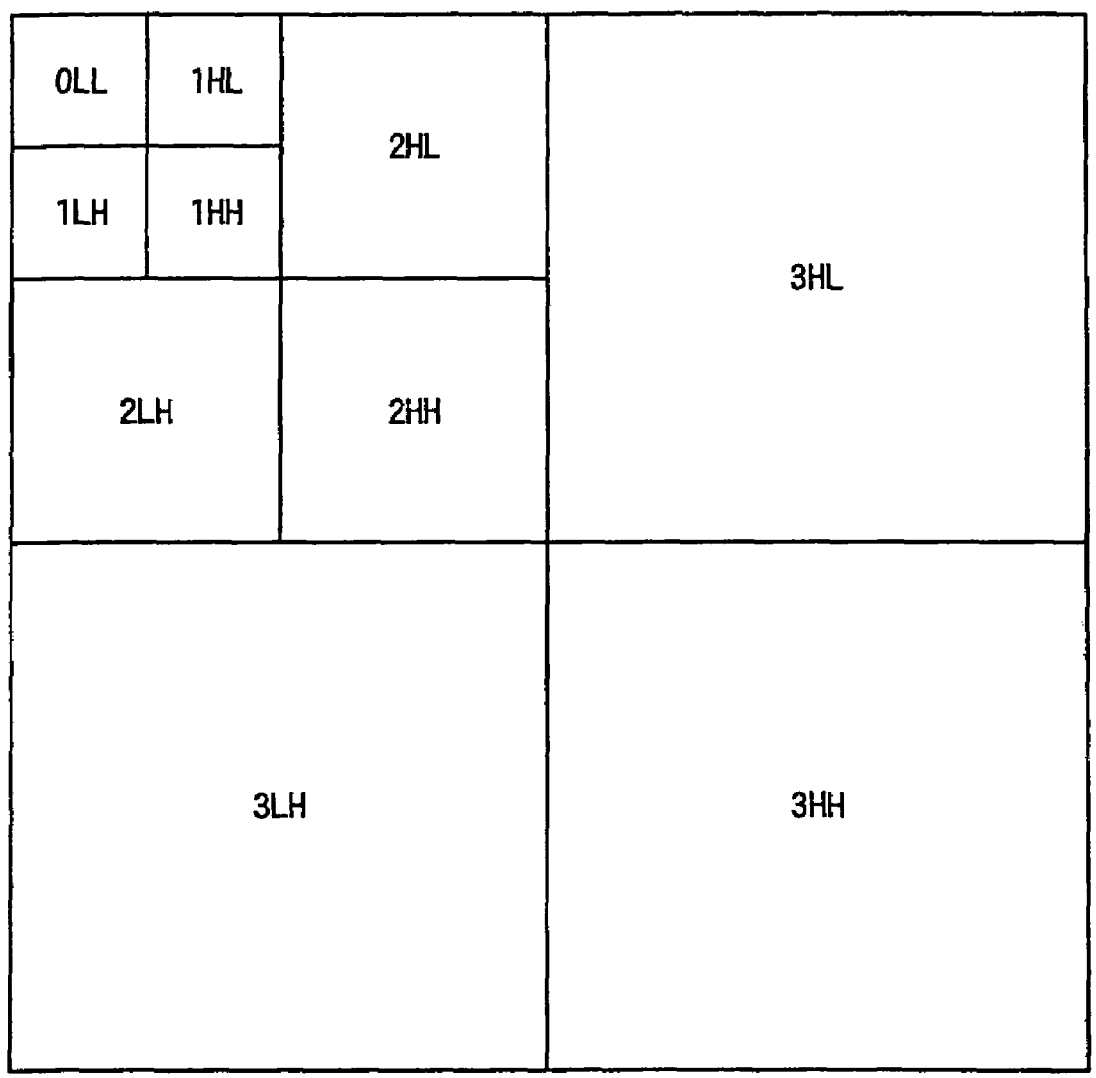
FIG. 2 shows subbands when a wavelet transform is performed three times.
Figure 3B:
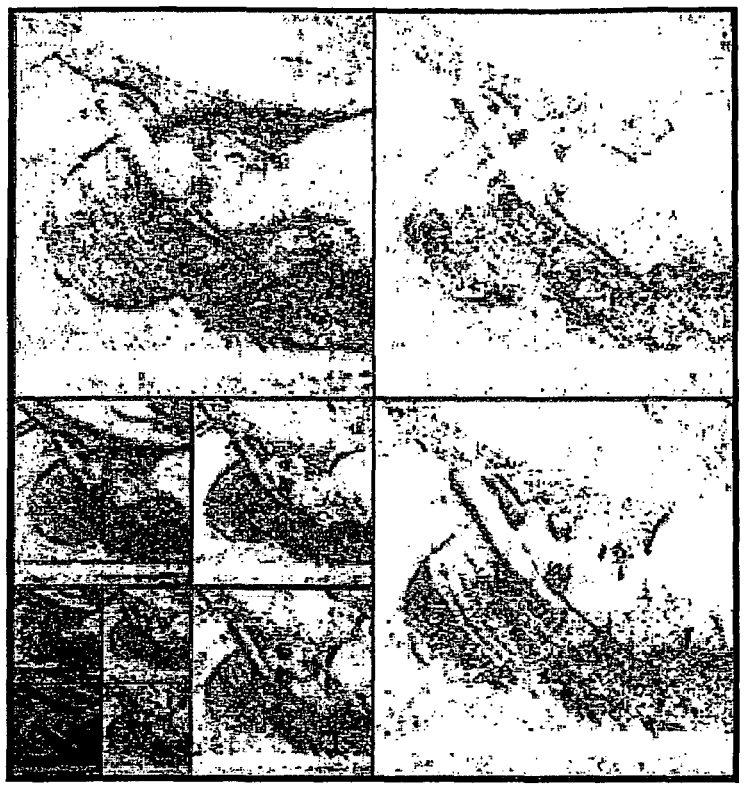
FIGS. 3A and 3B show subbands when an actual image is wavelet transformed.
Figure 3A:
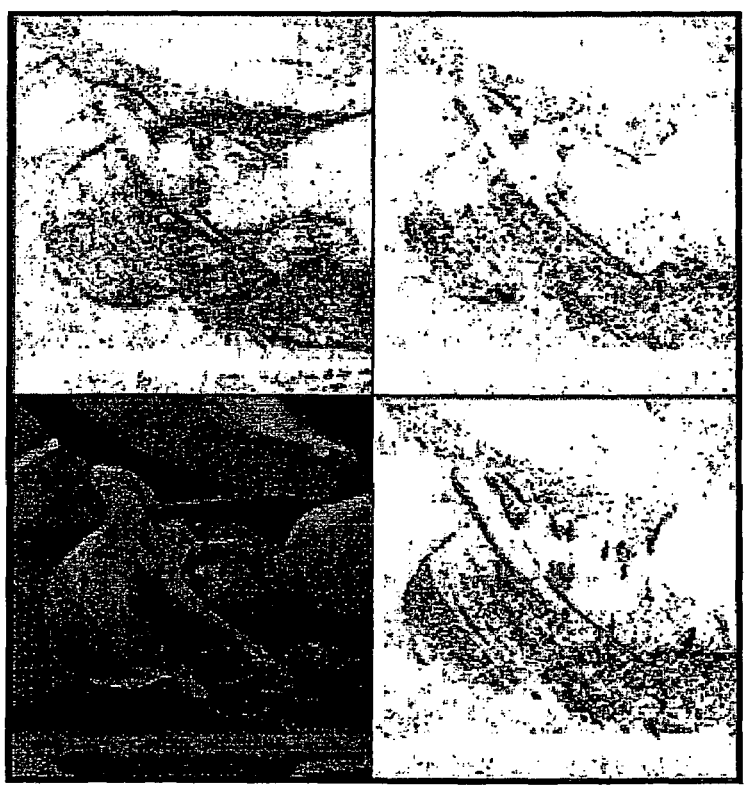

Generally, as shown in FIG. 2, the wavelet transform repeatedly transforms low-frequency components. This is because a large part of image energy concentrates on low frequency components. This can be also understood from the fact that subbands are formed as shown in FIG. 2 while the decomposition level is increased from decomposition level 1 in FIG. 3A to decomposition level 3 in FIG. 3B. The wavelet transform in FIG. 2 uses decomposition level 3. As a result, there are formed ten subbands in total. In FIG. 2, L and H represent low and high frequencies, respectively. Numbers prefixed to L and H represent decomposition levels. For example, 1LH represents a horizontally low and vertically high subband having decomposition level 1.

The quantization section 12 applies lossy compression to the wavelet transform coefficient D12 supplied from the wavelet transform section 11. Quantization means can use scalar quantization that divides the wavelet transform coefficient D12 by a quantization step size. The JPEG-2000 standard necessitates using the scalar quantization when the above-mentioned lossy compression is performed and when a lossy 9×7 wavelet transform filter is used. On the other hand, no quanization occurs when a lossless 5×3 wavelet transform filter is used. A rate control section 19 to be described later provides code amount control. Accordingly, the quantization section 12 in FIG. 1 actually operates when the lossy 9×7 wavelet transform filter is used. The following description assumes the use of the lossy 9×7 wavelet transform filter.

Figure 4:
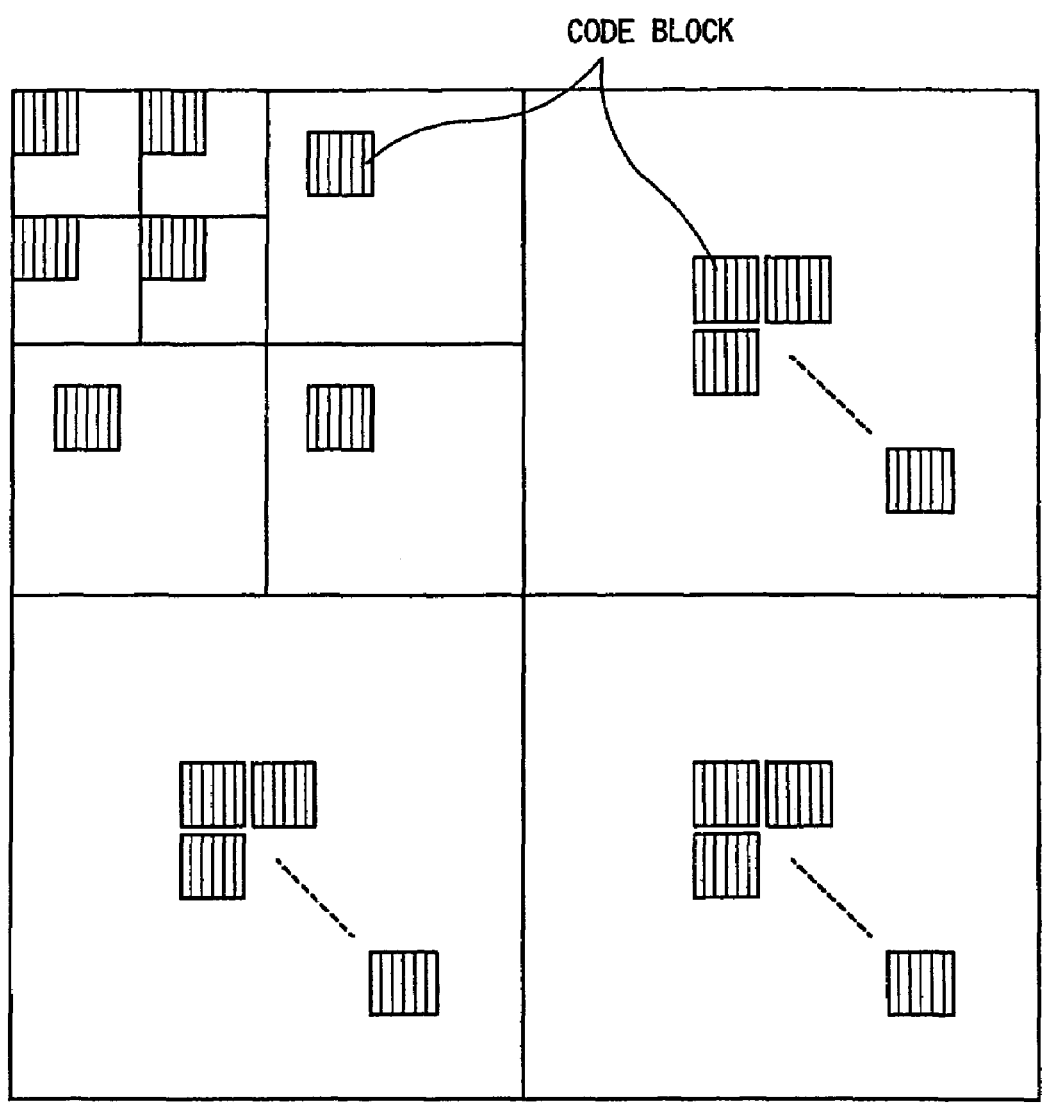
FIG. 4 shows relationship between a code block and a subband.

After the quantization section 12 generates the quantization coefficient D13, the code blocking section 13 divides this coefficient into code blocks each having a given size as an entropy coding process unit FIG. 4 shows positional relationship of code blocks in subbands. Normally, 64×64 sized code blocks are generated in all divided subbands. Let us assume that the 3LH subband in FIG. 2 has the smallest decomposition level and is sized to 640×320 samples. In this case, there are 50 code blocks in total each comprising 64×64 samples, i.e., ten code blocks horizontally and five vertically. The code blocking section 13 supplies the bit plane decomposition section 14 with the quantization coefficient D14 for each code block. The subsequent coding process is performed for each of the code blocks.

Figure 5:
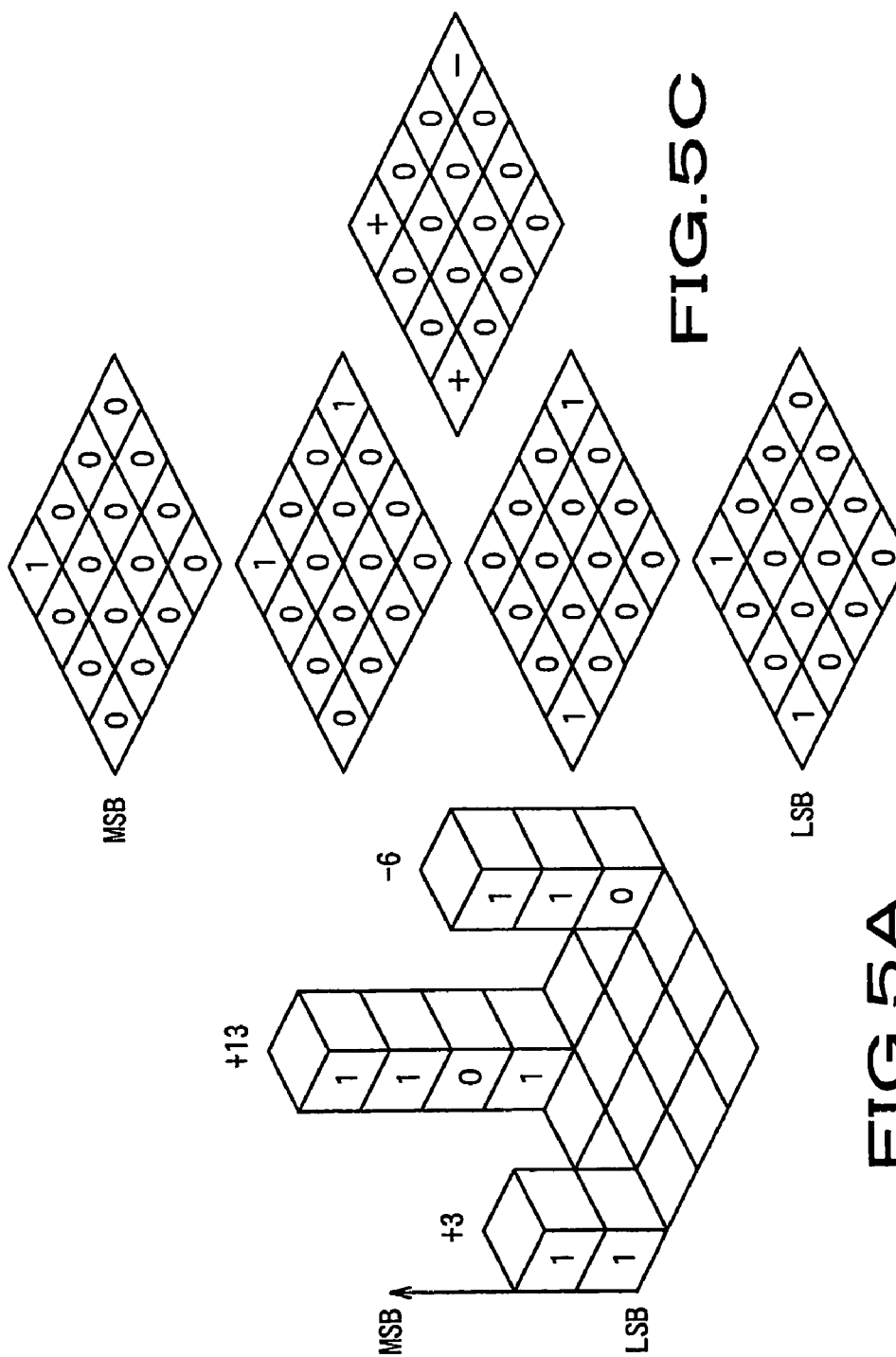

The bit plane decomposition section 14 decomposes the quantization coefficient D14 for each code block into bit planes. Referring now to FIG. 5, the concept of the bit plane will be described. FIG. 5A assumes 16 quantization coefficients comprising four coefficients vertically and four coefficients horizontally. Of the 16 coefficients, the maximum absolute value is 13 represented as 1101 in binary. Therefore, four bit planes as shown in FIG. 5B are used to represent absolute values of the coefficients. All elements of each bit plane are assigned values 0 or 1. With respect to quantization coefficient codes, −6 is the only negative value. The other quantization coefficients are 0 or positive values. Therefore, a bit plane for signs is provided as shown in FIG. 5C. The bit plane decomposition section 14 supplies the bit modeling section 15 with the quantization coefficient D15 decomposed into bit planes.

After the bit plane decomposition section 14 decomposes the quantization coefficient D15 into bit planes, the bit modeling section 15 performs coefficient bit modeling as follows. The bit modeling section 15 supplies the arithmetic coding section 16 with a symbol and a context D16 for each coefficient bit The arithmetic coding section 16 applies arithmetic coding to the symbol and the context D16 for each coefficient bit. The arithmetic coding section 16 supplies a resulting arithmetic code D17 to the code amount adding section 18. As an example, the embodiment especially describes entropy coding referred to as EBCOT specified in the JPEG-2000 standard. Details of EBCOT are described in such documents as "ISO/IEC 15444-1, Information technology—JPEG 2000, Part 1: Core coding system". As mentioned above, the bit modeling section 15 and the arithmetic coding section 16 constitute the EBCOT section 17.

EBCOT is means for coding by measuring a statistical amount of coefficient bits in each block having a given size. EBCOT performs entropy coding for quantization coefficients in units of code blocks. The code block is coded separately for each bit plane from the most significant bit (MSB) to the least significant bit (LSB). The vertical and horizontal sizes of the code block equal to 2 to the nth power ranging from 4 to 256. Normal sizes include 32×32, 64×64, 128×32, and the like. The quantization coefficient is represented in an n-bit signed binary number. Bit 0 to bit (n-2) represent the respective bits from LSB to MSB. The remaining one bit is used for a code. The code block is coded sequentially from the bit plane corresponding to MSB in accordance with the following three coding passes (a) through (c).

Figure 6:
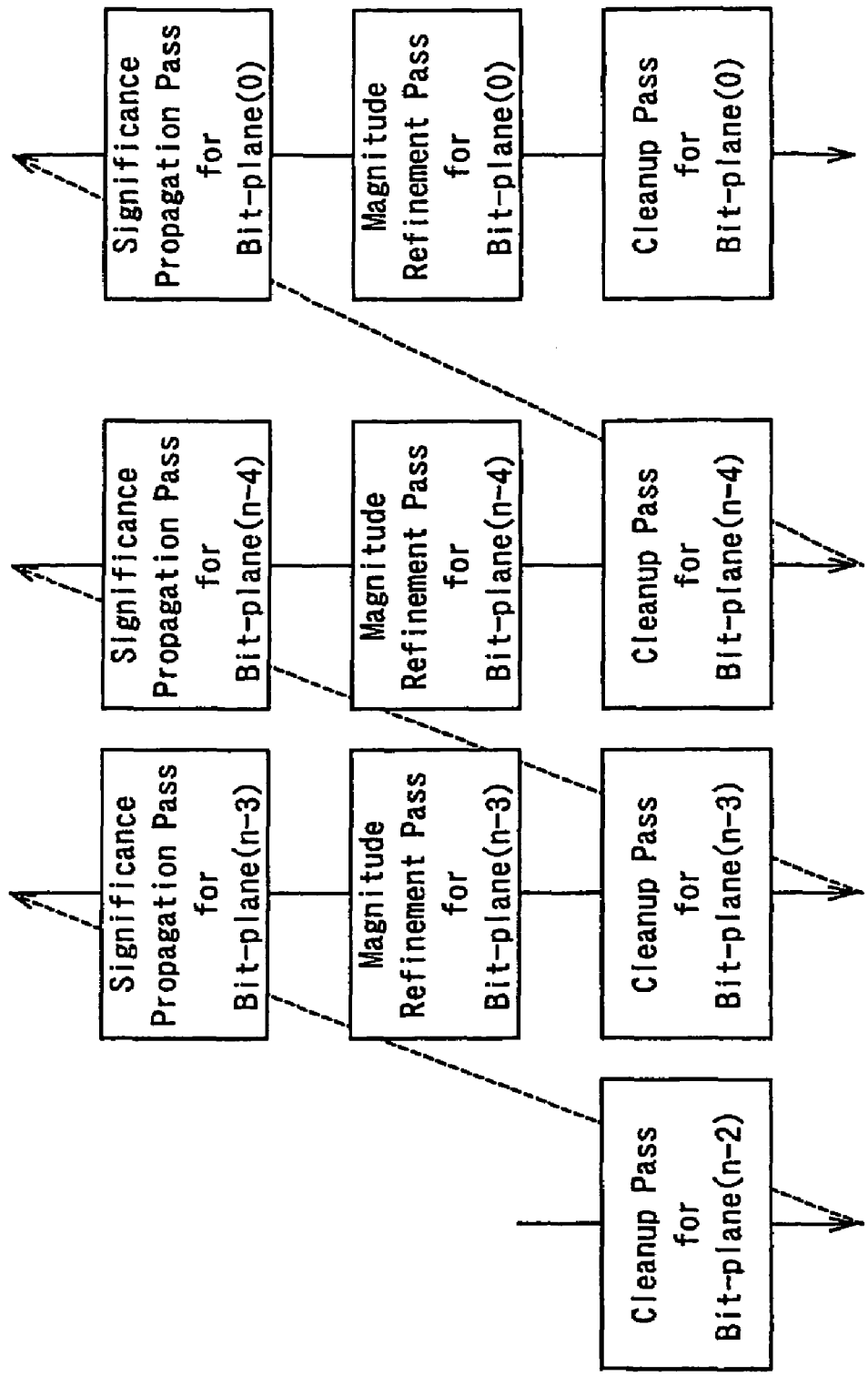
FIG. 6 shows a procedure to process coding passes in a code block.

(a) Significance Propagation Pass
(b) Magnitude Refinement Pass
(c) Clean Up Pass FIG. 6 shows a sequence of using the three coding passes. As shown in FIG. 6, bit plane (n-2) corresponding to the MSB is first coded by a Clean Up pass (appropriately referred to as a CU pass hereafter). Then, the other bit planes are sequentially coded toward the LSB through the use of a Significance Propagation pass (appropriately referred to as an SP pass hereafter), a Magnitude Refinement pass (appropriately referred to as an MR pass hereafter), and a CU pass in order.

Actually, however, a header records the first bit plane containing 1 from the MSB. No coding is performed for zero bit planes, i.e., bit planes containing only 0 coefficients. The three types of coding passes are repeatedly used according to the above-mentioned sequence to code bit planes. The coding is discontinued up to an unspecified bit plane and an unspecified coding pass to balance the code amount and the image quality, i.e., to enable the rate control.

Figure 7:
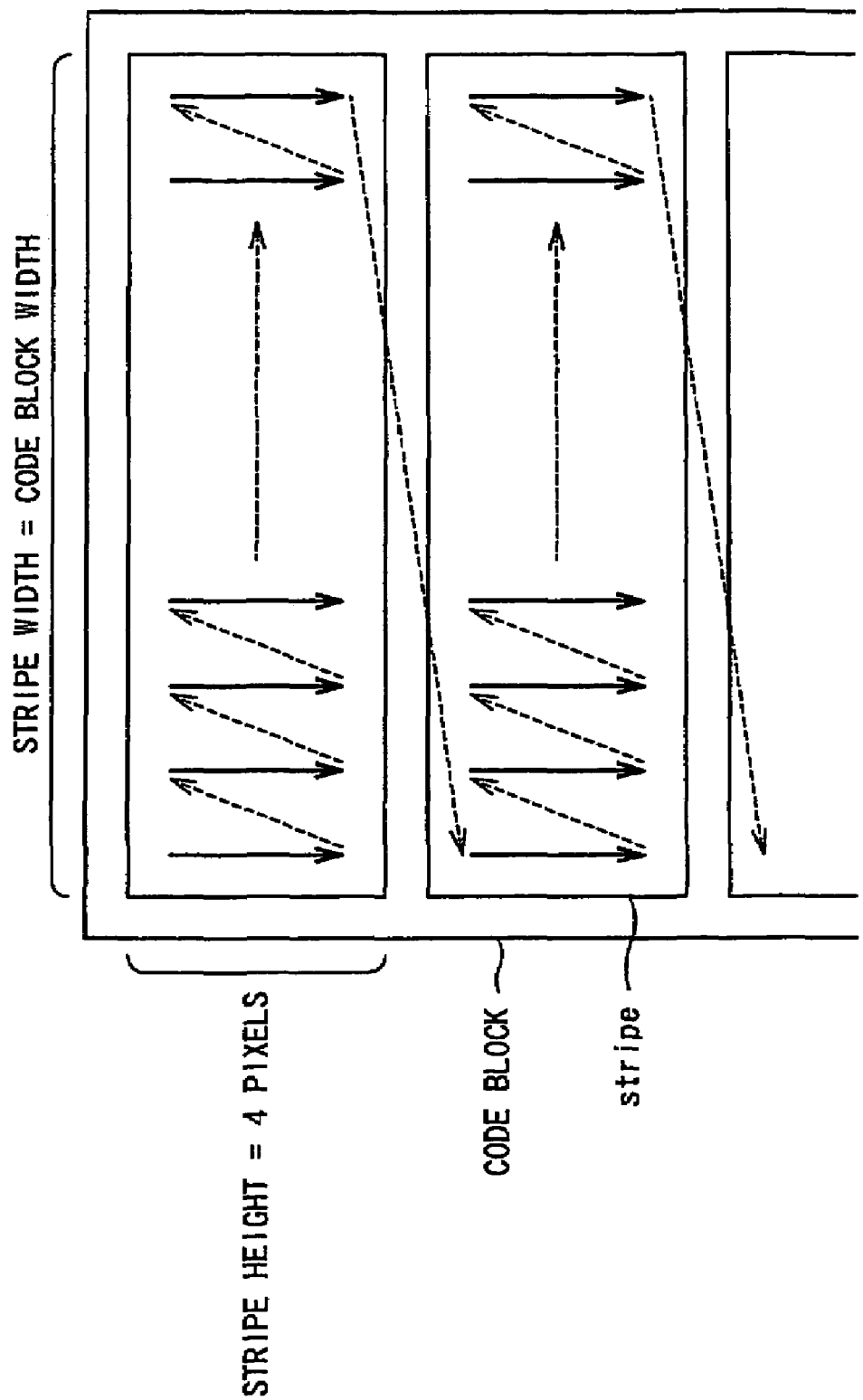
FIG. 7 shows a sequence of scanning coefficients in a code block.

FIG. 7 shows scanning of coefficient bits. The code block is divided into stripes each comprising four coefficient bits in height. The stripe width equals the code block width. The scan sequence applies to the way of following all coefficient bits in one code block The scan sequence progresses from top to bottom stripes in the code block, from left to right columns in each stripe, and top to bottom bits in each column. Each of the coding passes uses this scan sequence to process all coefficient bits in the code block.

The above-mentioned three coding passes will be described below. The three coding passes are described in such documents as "ISO/IEC 15444-1, Information technology—JPEG 2000, Part 1: Core coding system".

(a) Significance Propagation Pass

The SP pass is used for coding of a given bit plane and arithmetically codes non-significant coefficient bits in which at least one of eight adjacent coefficients is significant When the coded coefficient bit has value 1, the positive or negative code is then coded arithmetically.

The significance represents the state of a coder corresponding to each coefficient bit The significance is initially set to "0" indicating the non-significant state. When the coefficient is coded to 1, the significance changes to "1" indicating the significant state and always continues to be "1" thereafter. Accordingly, the significance can be used as a flag indicating whether or not information of effective digits is already coded. When the SP pass occurs for a given bit plane, no SP pass occurs for the subsequent bit planes.

(b) Magnitude Refinement Pass

The MR pass also encodes bit planes. Specifically, the MR pass arithmetically encodes significant coefficient bits that are not encoded by the SP pass.

(c) Clean Up Pass

The CU pass also encodes bit planes. Specifically, the CU pass arithmetically encodes nonsignificant coefficient bits that are not encoded by the SP pass. When the encoded coefficient bit has value 1, the positive or negative code is then coded arithmetically.

The arithmetic coding of the three coding passes selects coefficient contexts using ZC (Zero Coding), RLC (Run-Length Coding), SC (Sign Coding), or MR (Magnitude Refinement) depending on cases. The arithmetic coding called MQ coding encodes coefficient bit symbols and selected contexts. The MQ coding is defined as learning type binary arithmetic coding in JBIG2. The MQ coding is described in such documents as ISO/IEC FDIS 14492, "Lossy/Lossless Coding of Bi-level Images", March 2000. The JPEG-2000 standard specifies 19 types of context in total for all coding passes.

As mentioned above, the bit modeling section 15 uses the three coding passes to process the quantization coefficient D15 for each bit plane to generate the symbol and the context D16 for each coefficient bit. The arithmetic coding section 16 applies arithmetic coding to the symbol and the context D16 for each coefficient bit.

The code amount adding section 18 accumulates code amounts of the arithmetic codes D17 supplied from the arithmetic coding section 16 and supplies an accumulated value to the control section 19. The control section 19 compares the accumulated value with a targeted code amount. When the accumulated value does not reach the targeted code amount, the control section 19 transmits a control signal D19 to the EBCOT section 17 for encoding the next bit plane. When the accumulated value reaches the targeted code amount, the code amount adding section 18 supplies an encoded code stream D20 after completion of the code amount control to the header generation section 20 and the packet generation section 21. The description to follow will provide details about processes in the code amount adding section 18 and the control section 19, the coding sequence of each bit plane, and the like.

The header generation section 20 is supplied with the encoded code stream D20 from the code amount adding section 18. Based on the encoded code stream D20, the header generation section 20 generates a header D21, i.e., additional information in the code block such as the number of coding passes in the code block, the data length of the encoded code stream D20, and the like. The header generation section 20 supplies the header D21 to the packet generation section 21.

Figure 8:
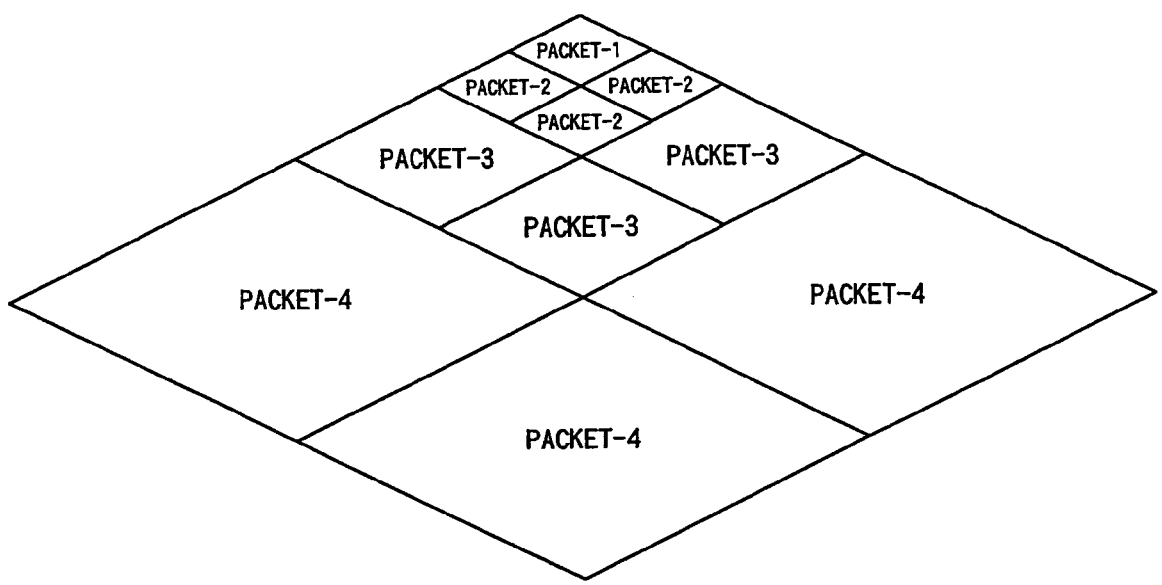
FIG. 8 shows packets generated in the image encoding apparatus.

The packet generation section 21 combines the encoded code stream D20 with the header D21 to generate a packet D22. The packet generation section 21 then outputs the packet outside. At this time, as shown in FIG. 8, the packet generation section 21 generates packets at the same resolution level. As seen from FIG. 8, the lowest packet 1 contains only LL components. The other packets 2 through 4 contains LH, HL, and HH components.

As mentioned above, the image encoding apparatus 1 according to the embodiment can use the wavelet transform and the entropy coding to efficiently compress and encode input images and packetize them for output.

(2) Applicable Portions in the Image Encoding Apparatus (2-1) Operations of the Code Amount Adding Section and the Control Section Generally, when an image encoding apparatus uses JPEG-2000 to compress and encode input images, the apparatus is subject to very high process load for the entropy coding in the EBCOT. On the other hand, when a targeted compressibility ratio or bit rate is used for encoding, part of the encoded results after the EBCOT coding is unused and is consequently wasteful.

To solve this problem, the code amount adding section 18 according to the embodiment accumulates code amounts of the arithmetic codes D17 for each bit plane encoded in the EBCOT section 17 and supplies an accumulated value to the control section 19. The control section 19 compares this accumulated value with the targeted code amount When the accumulated value does not reach the targeted code amount, the control section 19 transmits the control signal D19 to the EBCOT section 17 to encode the next bit plane. When the accumulated value reaches the targeted code amount, the code amount adding section 18 supplies the encoded code stream D20 after completion of the code amount control to the header generation section 20 and the packet generation section 21.

At this time, the EBCOT section 17 performs bit modeling of the quantization coefficient D15 by traversing all the code blocks for each of the bit planes from the one having the highest bit position to the one having the lowest bit position in order. The EBCOT section 17 then arithmetically encodes the resulting symbol and context D16 for each coefficient bit.

Figure 9:
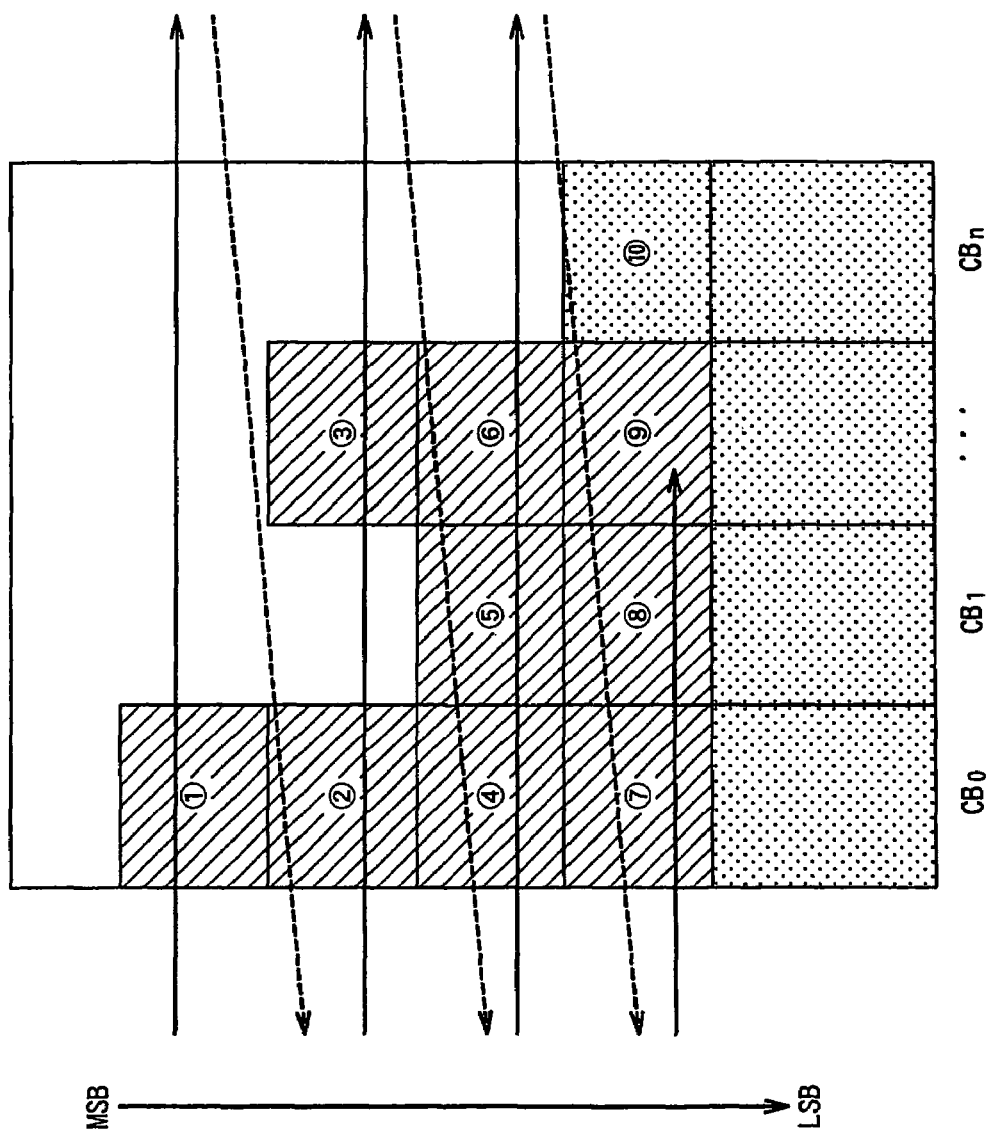
FIG. 9 shows a sequence of selecting bit planes in one subband.

The coding progresses in a subband as indicated by arrows in FIG. 9. Specifically, bit planes are encoded from a code block (CB0) having the highest priority to a code block (CBn) having the lowest priority. In each code block, bit planes are encoded from the one having the highest bit position at the MSB to the one having the lowest bit position at the LSB. In FIG. 9, no encoding is performed for zero bit planes that contain only 0 coefficients. Actually, the encoding is first applied to the bit plane indicated by circled number 1. At this bit position, there is only the bit plane indicated by circled number 1. Only this bit plane is encoded, and control proceeds to the next bit position. At the next bit position, the encoding is applied to the bit planes indicated by circled numbers 2 and 3. This operation is repeated to accumulate code amounts generated by encoding the bit planes. When the accumulated value reaches the targeted code amount, e.g., the bit plane indicated by circled number 9 in the figure, the encoding terminates for the remaining bit planes. Therefore, the EBCOT section 17 does not encode the bit plane indicated by circled number 10 though it corresponds to the same bit position as the bit plane indicated by circled number 9.

Figure 10:
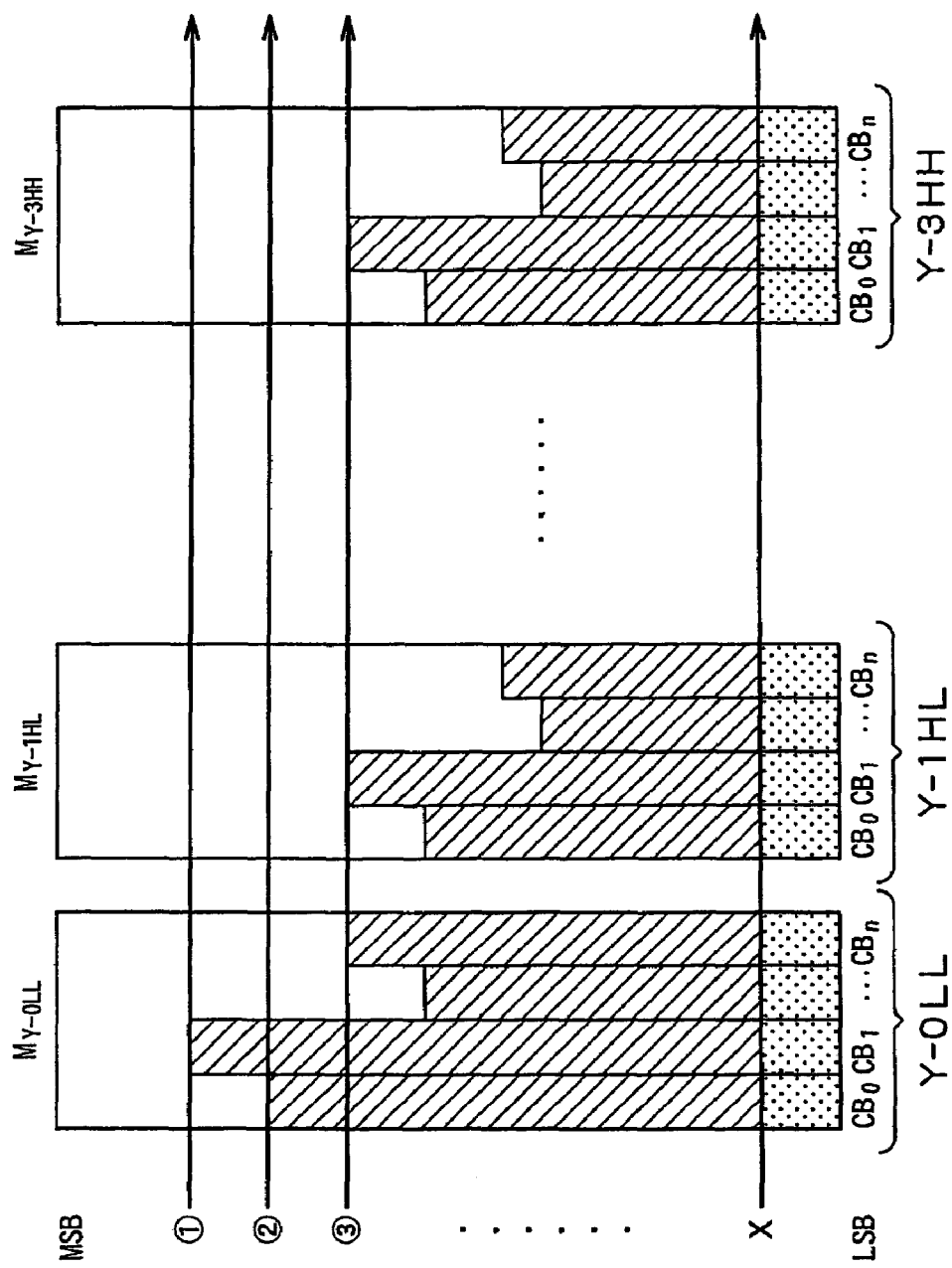
FIG. 10 shows a sequence of selecting bit planes among a plurality of subbands.
Figure 11:
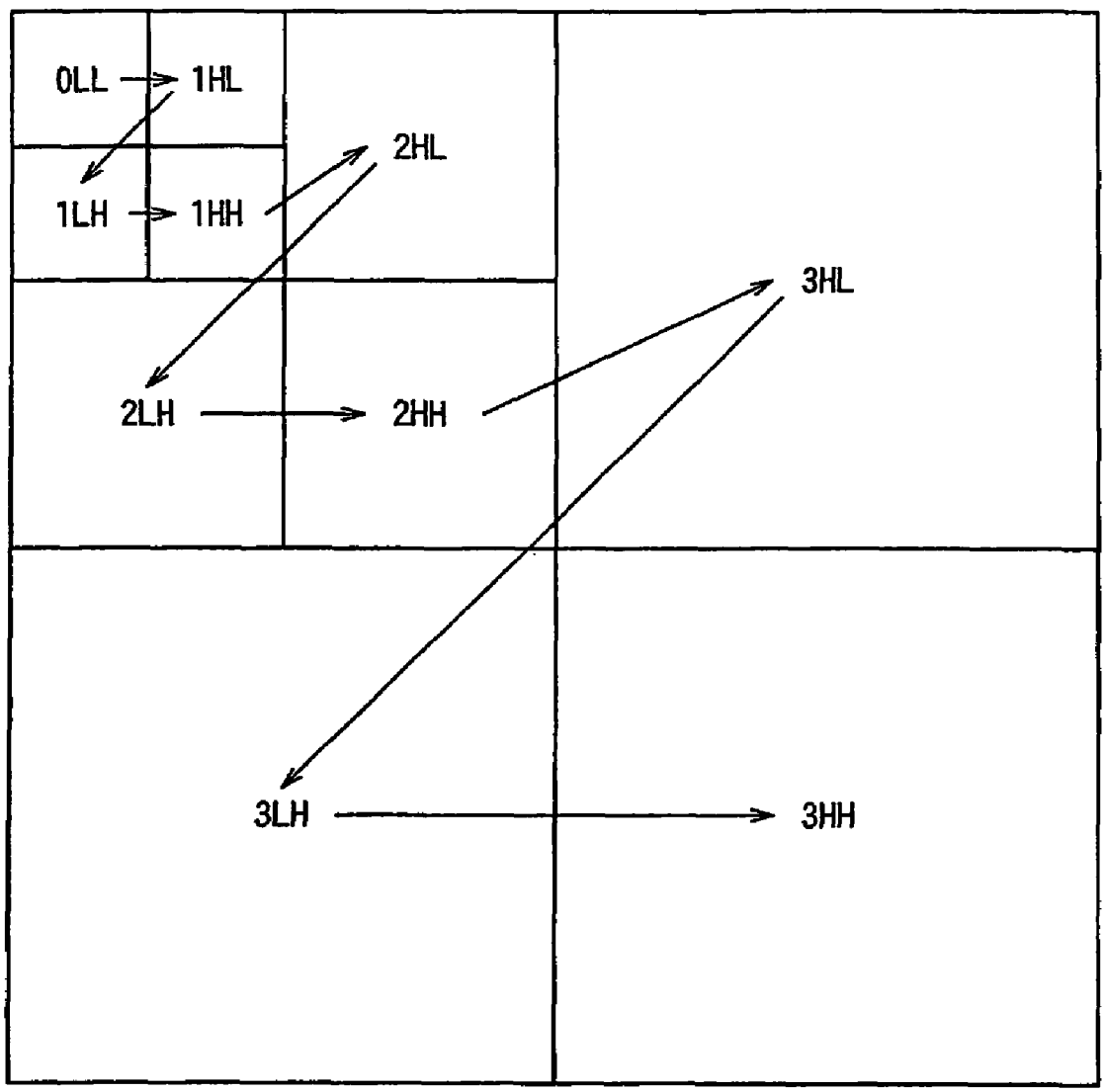
FIG. 11 shows priorities among a plurality of subbands.

FIG. 9 represents an example of encoding one subband. Further, there may be a case of encoding all subbands for brightness component Y by performing the wavelet transform three times as shown in FIG. 2. In this case, the encoding progresses according to a sequence as shown in FIG. 10. That is to say, as indicated by arrows in FIG. 10, the encoding progresses by traversing all code blocks in all subbands from the bit plane having the highest bit position to the bit plane having the lowest bit position. When bit planes are available between subbands at the same bit position, the subbands are selected from the lowest one to the highest one. When the wavelet transform is performed three times as shown in FIG. 2, for example, subbands are selected in the order of 0LL, 1HL, 1LH, 1HH, 2HL, 2LH, 2HH, 3HL, 3LH, and 3HH as shown in FIG. 11. This is because major parts of the image more concentrate on low frequencies than on high frequencies.

Figure 12:
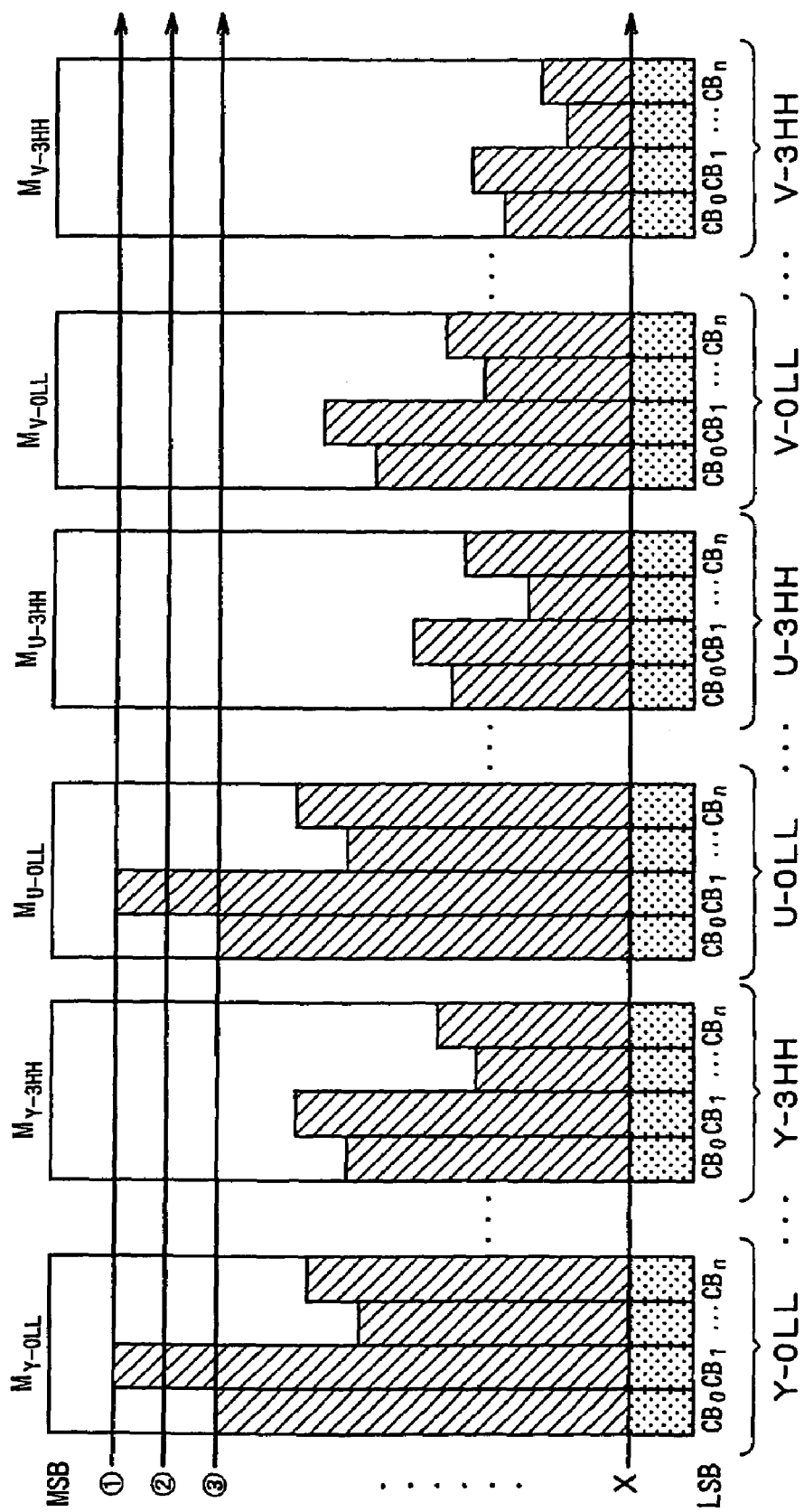
FIG. 12 shows a sequence of selecting bit planes when three components are available.

When an image comprises a plurality of components, the encoding progresses according to a sequence as shown in FIG. 12. FIG. 12 shows that an image comprises three components in total, i.e., brightness component Y and color difference components U and V. First, with respect to brightness component Y in FIG. 12, bit planes at the same bit position are encoded from Y-0LL to Y-3HH in order. Then, with respect to color difference component U, bit planes at the same bit position are encoded likewise. Finally, with respect to color difference component V, bit planes at the same bit position are encoded. When the encoding is complete up to subband V-3HH, control moves to the bit position one bit lower. Then, the same process restarts to encode bit planes at the same bit position from Y-0LL.

The encoding in FIG. 12 progresses in the order of Y, U, and V. This is because visual characteristics of human being are generally more sensitive to brightness components than to color difference components. However, importances of color difference components U and V depend on an input image. It is desirable to be able to vary priorities as needed.

Figures 13, 14, 15:
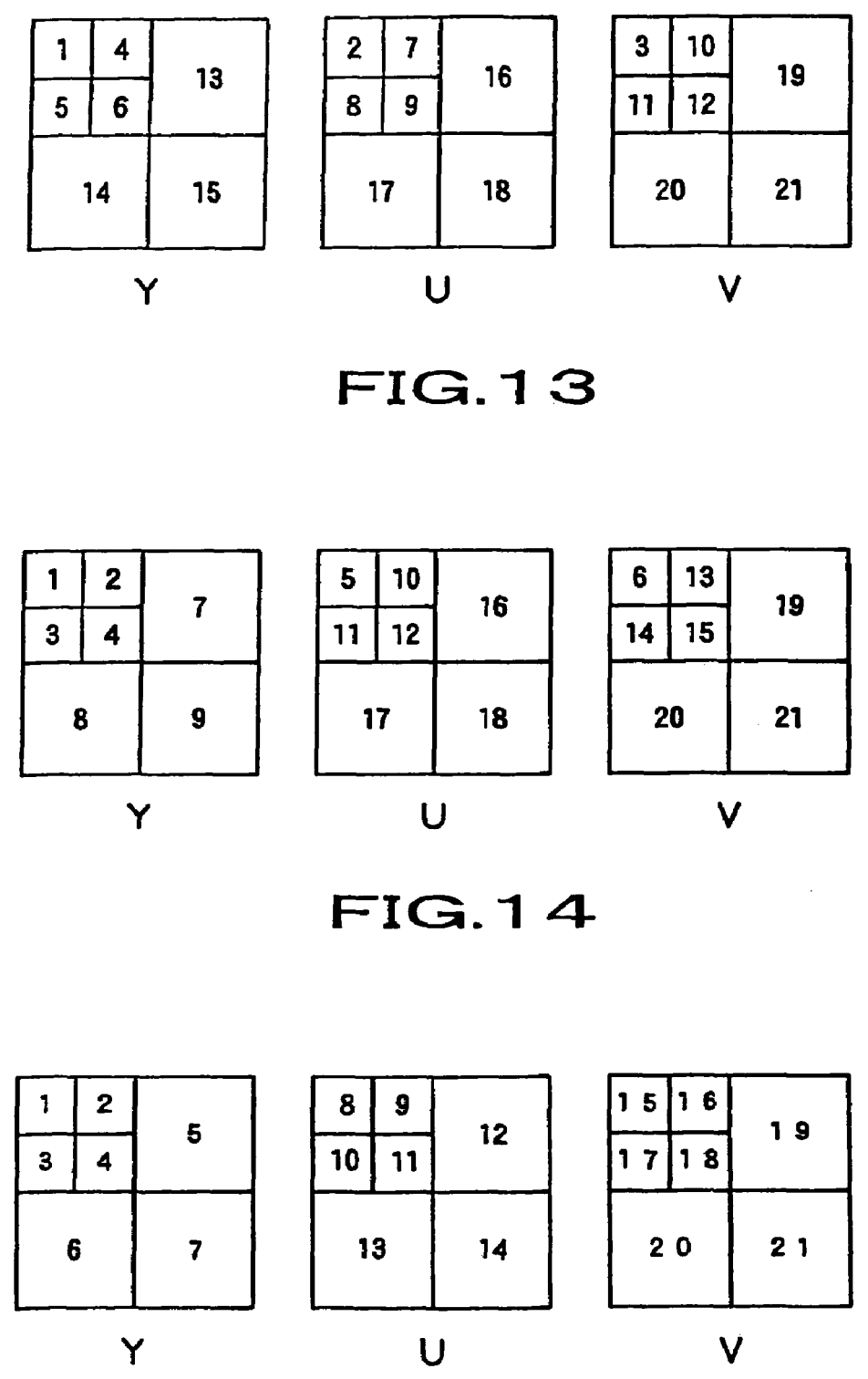

When three components Y, U, and V are used, subband priorities are available in variations as shown in FIGS. 13 through 15. FIG. 13 prioritizes the brightness component as mentioned above. After all subbands for brightness component Y are encoded, all subbands for color difference component U are then encoded. Finally, all subbands for color difference component V are encoded. In FIG. 14, encoding is performed for all components at the lowest frequency, and then encoding is performed for the other components at higher frequencies in order. This priority is recommended when low-frequency information about color differences needs to take precedence over texture having fine brightness. FIG. 15 is a mixture of FIGS. 13 and 14. In FIG. 15, subbands for brightness component Y are processed up to frequencies slightly higher than those for color difference components U and V. This priority is recommended when the brightness component needs to take precedence, but not to the degree of FIG. 13. FIG. 15 shows an example of the mixed type. The other sequences may be preferable.

Figure 16:
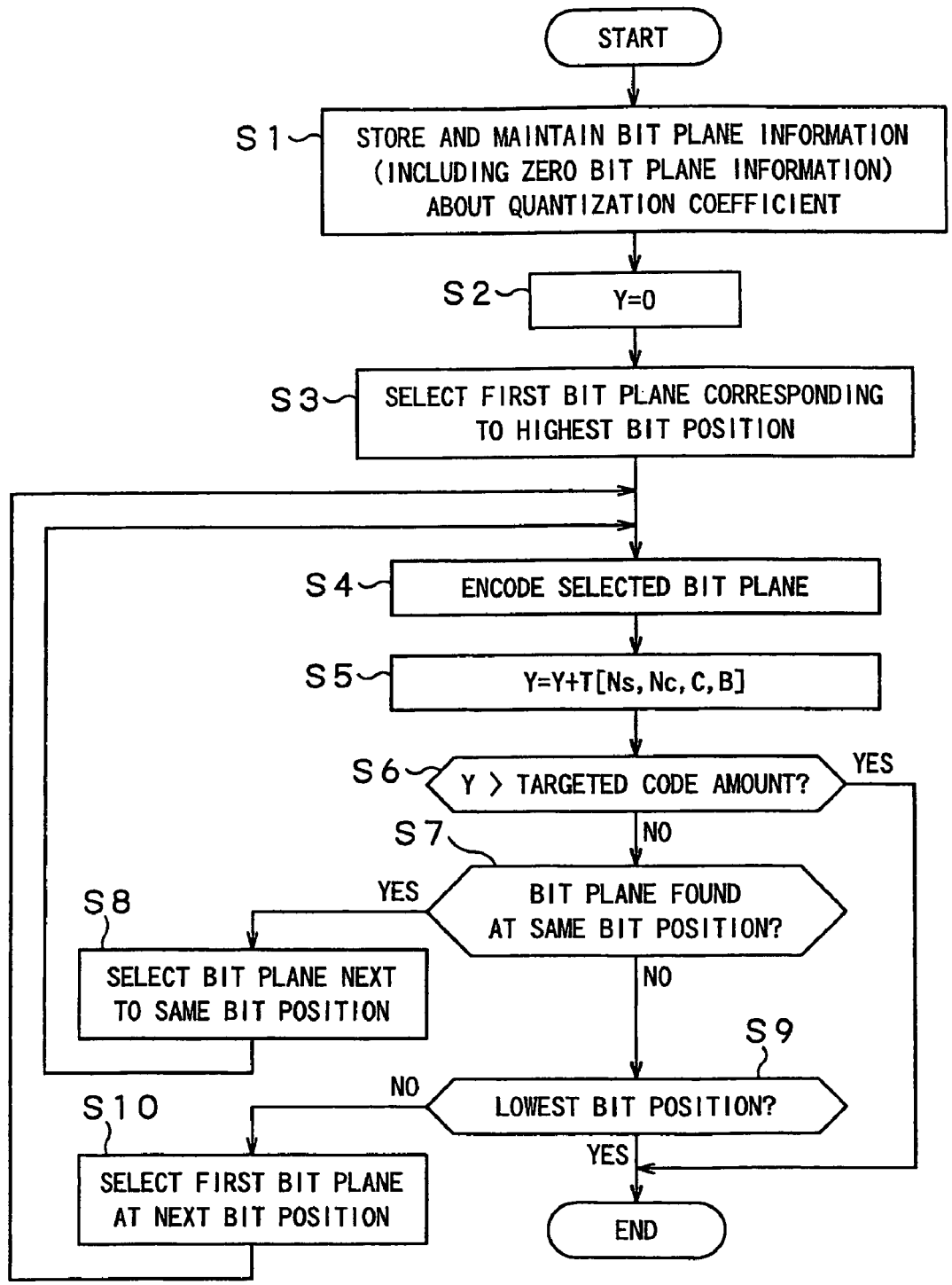
FIG. 16 is a flowchart showing a process to add code amounts for each bit plane.

A flowchart in FIG. 16 shows the above-mentioned process of adding code amounts for each bit plane. FIG. 16 shows not only the processes in the code amount adding section 18 and the control section 19, but also the encoding process in the EBCOT section 17.

At step S1, when the operation of the bit plane decomposition section 14 terminates, the process stores and maintains bit plane information (including zero bit plane information) about the quantization coefficient.

At step S2, accumulated code amount Y is initialized to 0. At step S3, the process goes to select the first bit plane corresponding to the highest bit position among subbands including zero bit planes. As mentioned above, when there is a plurality of bit planes at the same bit position, the process proceeds to select subbands from the lowest one to the highest one and select components in the order of Y, U, and V, for example.

At step S4, the process encodes the selected bit plane. At step S5, the process goes to add the bit plane's code amount T [Ns, Nc, C, B] to Y. In this case, Ns denotes a subband number, Nc a component number, C a code block number, and B a bit plane number. The description to follow will provide details about the method of calculating the code amount for each bit plane.

At step S6, whether or not accumulated code amount Y exceeds the targeted code amount is determined. If accumulated code amount Y exceeds the targeted code amount (Yes), the process terminates. The header generation section 20 and the packet generation section 21 are supplied with the encoded code stream D20 including arithmetic codes for so far encoded bit planes. Strictly speaking, since the targeted code amount is exceeded, there may be a need to keep the accumulated code amount below the targeted code amount. In this case, it is preferable to supply the header generation section 20 and the packet generation section 21 with the encoded code stream D20 including arithmetic codes up to the second last bit plane. If the accumulated code amount Y is smaller than the targeted code amount (No), the process proceeds to step S7.

At step S7, it is determined whether or not there is a bit plane at the same bit position. If there is a bit plane at the same bit position (Yes), the process proceeds to step S8, to select the next bit plane, and then returns to step S4. If there is no bit plane at the same bit position (No), the process proceeds to step S9.

At step S9, it is determined whether or not the bit position is lowest, i.e., the least significant bit (LSB) is reached. If the bit position is the lowest (Yes), the process terminates. Otherwise (No), the process proceeds to step S10, to select the first bit plane at the next bit position toward the least significant bit (LSB), and then returns to step S4.

The EBCOT section 17, the code amount adding section 18, and the control section 19 according to the present embodiment perform the process as mentioned above. The process proceeds to encode quantization coefficients for the respective bit planes in the specified sequence. The process then goes to accumulate code amounts of arithmetic codes acquired each time the coding of each bit plane terminates thereby comparing the accumulated code amount with the targeted code amount. Only when the accumulated code amount is smaller than the targeted code amount, encoding of the next bit plane is conducted. Finally truncated bit planes can contribute to omission of EBCOT processes that cause high calculation load, making it possible to fast complete the encoding. The small calculation amount can realize energy saving. Further, the encoding progresses from highly prioritized bit planes that have significant effect on the image quality. Accordingly, the same code amount can maintain high image quality.

(2-1-2) Modifications

The above-mentioned example has explained the case of a single layer. Moreover, the JPEG-2000 standard is capable of multilayering. That is to say, an encoding side can divide a plurality of bit planes into a plurality of layers along the direction from the MSB to the LSB and can packetize the respective layers. A decoding side maintains the variable number of layers to be decoded, making the scalability feasible.

Figure 17:
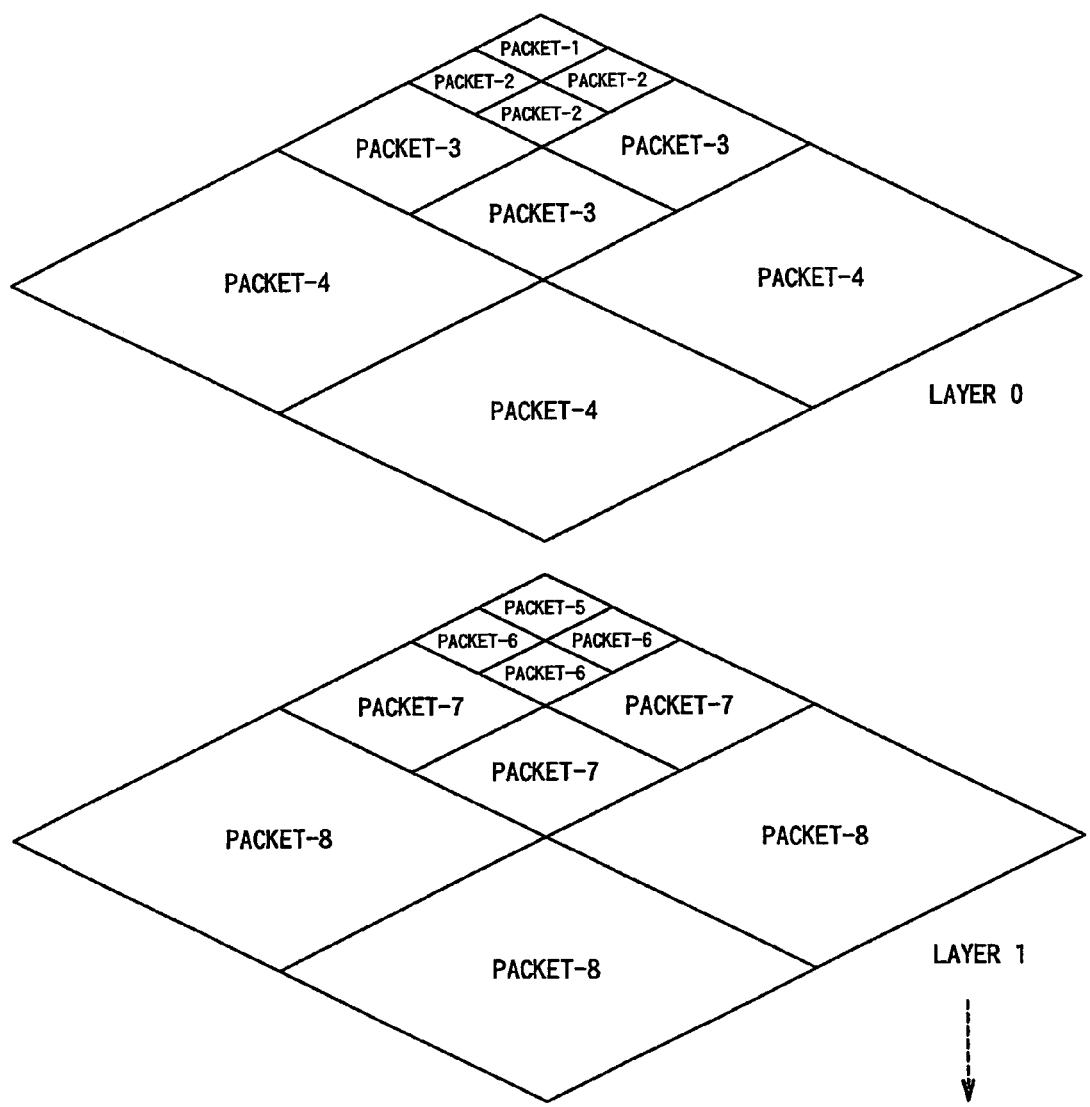
FIG. 17 is a multilayered version of FIG. 8.
Figure 18:
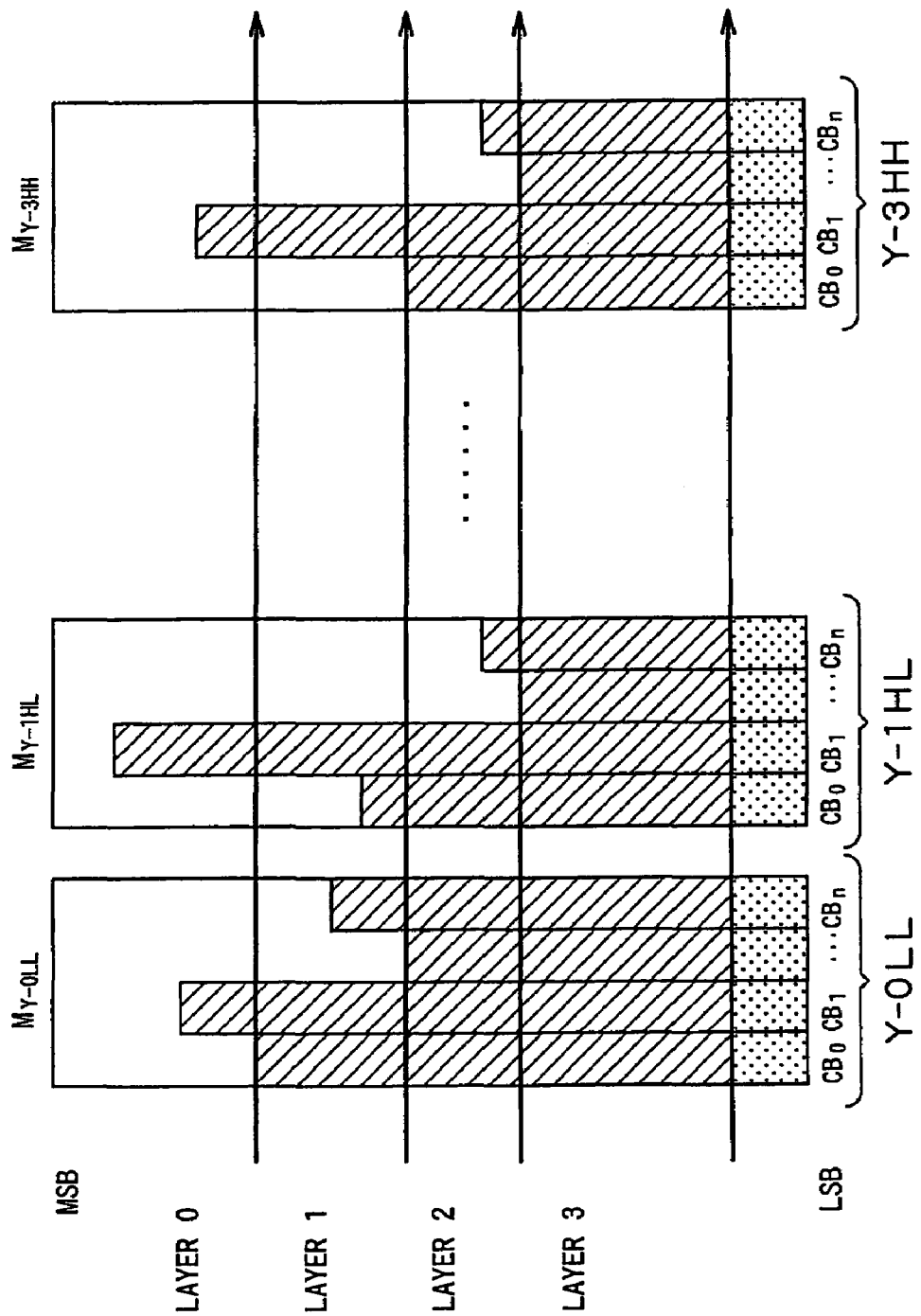
FIG. 18 is a multilayered version of FIG. 10.

FIG. 17 is a multilayered version of the single layer in FIG. 8. It can be understood that increasing layers also increases packets. FIG. 18 is a multilayered version of FIG. 10. FIG. 18 shows the division of four layers 0, 1, 2, and 3. Shaded portions in each layer correspond to bit planes encoded by the EBCOT section 17. As seen from FIG. 18, layer 0 contains many zero bit planes. On the other hand, layer 3 contains no zero bit planes and allows all bit planes to be encoded.

Basically, the multilayer version follows the flowchart in FIG. 16 as the process of accumulating code amounts. In addition, a targeted code amount can be specified for each layer. When the targeted code amount is reached in a given layer, the remaining bit planes in this layer are not encoded. The encoding starts from the first bit plane in the next layer. It may be preferable to define the number of layers to be encoded.

(2-2) Calculating a Code Amount for Each Coding Pass

In arithmetic coding according to the JPEG-2000 standard, a code is output upon termination of the last arithmetic coding in a coding pass or a bit plane. Generally, it is impossible to assume the length of this code as is to be the length of the code for the coding pass or the bit plane.

To solve this problem, the following describes the method of finding a code amount for each coding pass. A code amount for each bit plane can be found as the sum of code amounts for each coding pass and a description is omitted.

According to the JPEG-2000 standard encoding, a coding pass may or may not be terminated. When the coding pass is terminated, the length of an output code directly corresponds to the code amount of the coding pass. When the coding pass is not terminated, the code amount of the coding pass contains not only the output code, but also data in a B buffer and a C register in FIG. 19. The B buffer and the C register are included in the arithmetic coding section 16 in FIG. 1. A JPEG-2000 encoding mode determines whether or not a given coding pass is terminated. The default encoding mode terminates only the last coding pass in each code block. The other coding passes are not terminated. Therefore, it is important to find code amounts when the coding pass is not terminated.

According to this embodiment, when the coding pass is not terminated, and output of a code amount is assumed to be L upon termination of the last arithmetic coding in that coding pass. In this case, the code amount of the coding pass is calculated as L plus 3.

Figure 19:
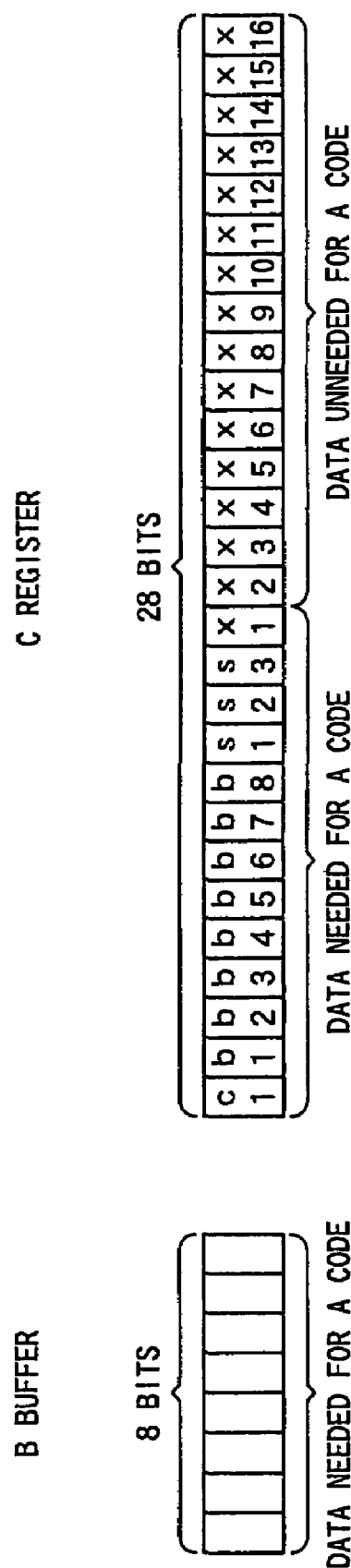
FIG. 19 shows a B buffer and a C register in an arithmetic coding section of the image encoding apparatus.

The following describes validity of this calculation method. As shown in FIG. 19, the B buffer constitutes an 8-bit area. The C register constitutes a 28-bit area. The C register comprises carry bit c1, byte output bits b1 through b8, spacer bits s1 through s3, and fraction part bits x1 through x16 from the highest bit in order. One characteristic is that representing information up to the coding pass just needs data in the B buffer and data in the C register ranging from the carry bit c1 to the highest fraction part bit x1.

The C register is used to calculate an arithmetic code. A CT counter is provided to count the number of times the C register is left-shifted during calculation of the arithmetic code. The counter value is decremented by one each time the C register is left shifted. When the CT counter value reaches 0, 1-byte data is output from the C register to the B buffer.

This process will be described later in two cases, i.e., when the B buffer contains hexadecimal FF and does not.

Figure 20:
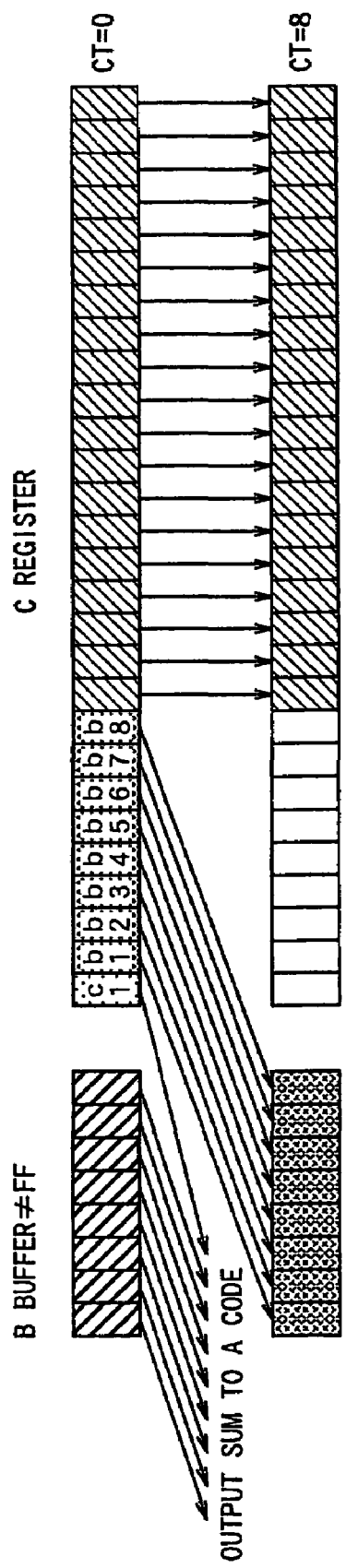
FIG. 20 shows settled code output when the B buffer does not contain hexadecimal FF.

Firstly, let us assume that the B buffer does not contain hexadecimal FF as shown in FIG. 20. The process first proceeds to add data in the B buffer to the value of carry bit c1 and output the sum as a settled code. Then, values for byte output bits b1 through b8 in the C register are moved to the B buffer. The CT counter value is set to 8.

Figure 21:
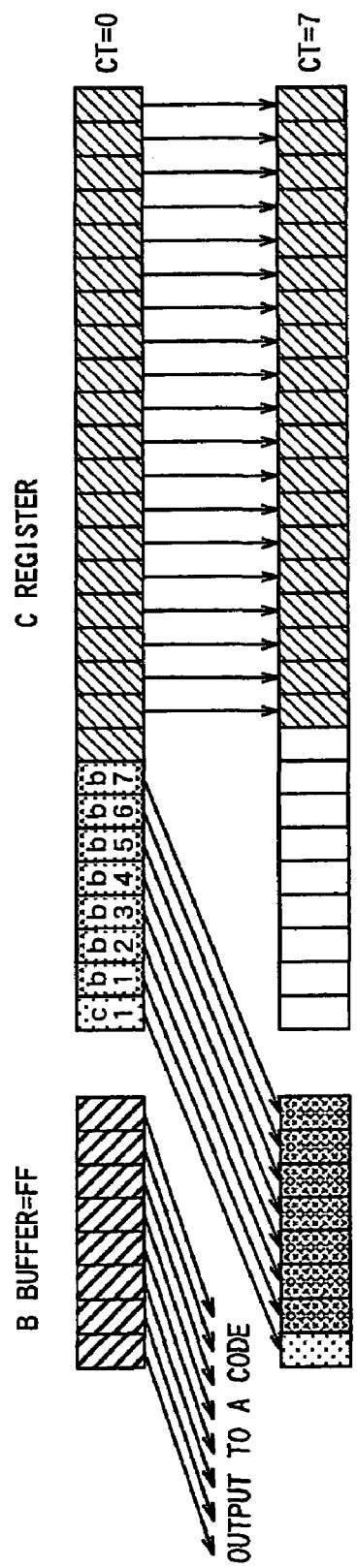
FIG. 21 shows settled code output when the B buffer contains hexadecimal FF.

Secondly, let us assume that the B buffer contains hexadecimal FF as shown in FIG. 21. The B buffer content is unchangedly output as a settled code. Then carry bit c1 and values for byte output bits b1 through b7 in the C register are moved to the B buffer. Further, the CT counter value is set to 7.

The following describes operations until data needed for the code shown in FIG. 19 is actually output as a settled code.

Figure 22:
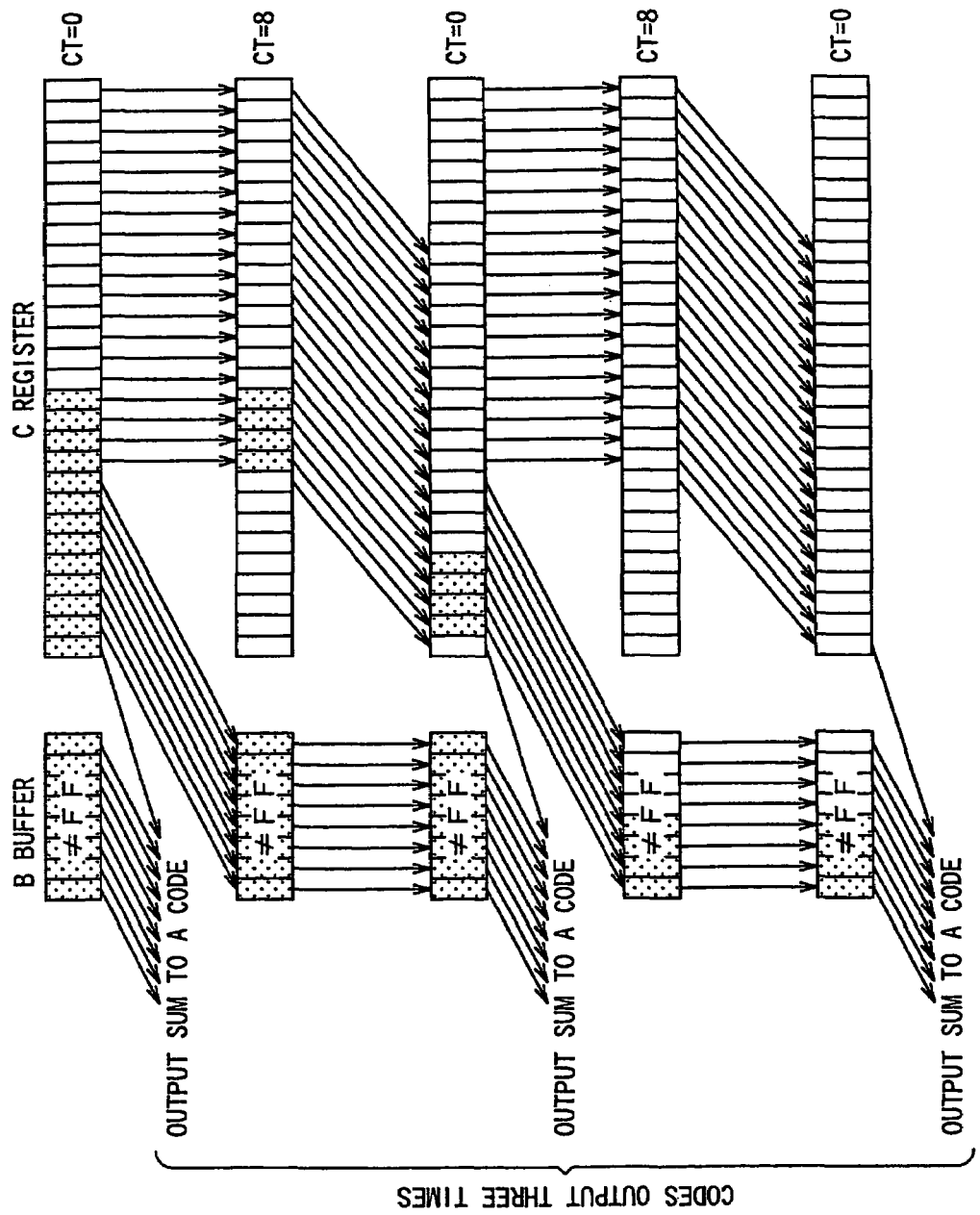
FIGS. 22A-E show an operation until data needed for a code is output as a settled code when the process in FIG. 20 is always applied.

With reference to FIG. 22, the following describes an example where the B buffer does not contain FF and the process shown in FIG. 20 is always applied. State (a) illustrates the B buffer and the C register when the coding pass has completed the last arithmetic coding. Applying the process in FIG. 20 enables state (b). The first code byte is settled and is output. The C register is then left-shifted eight times until CT is reset to 0 to enable state (c). Applying the process in FIG. 20 enables state (d). The second code byte is settled and is output The C register is then left-shifted eight times until CT is reset to 0 to enable state (e). In state (e), data needed for the code remains in the B buffer only. Accordingly, the third operation to settle and output the code byte outputs all data needed for the code. In this manner, the code amount of the coding pass at this time is equivalent to 3 added to the code amount settled to be output when the coding pass has completed the last arithmetic coding.

Figure 23:
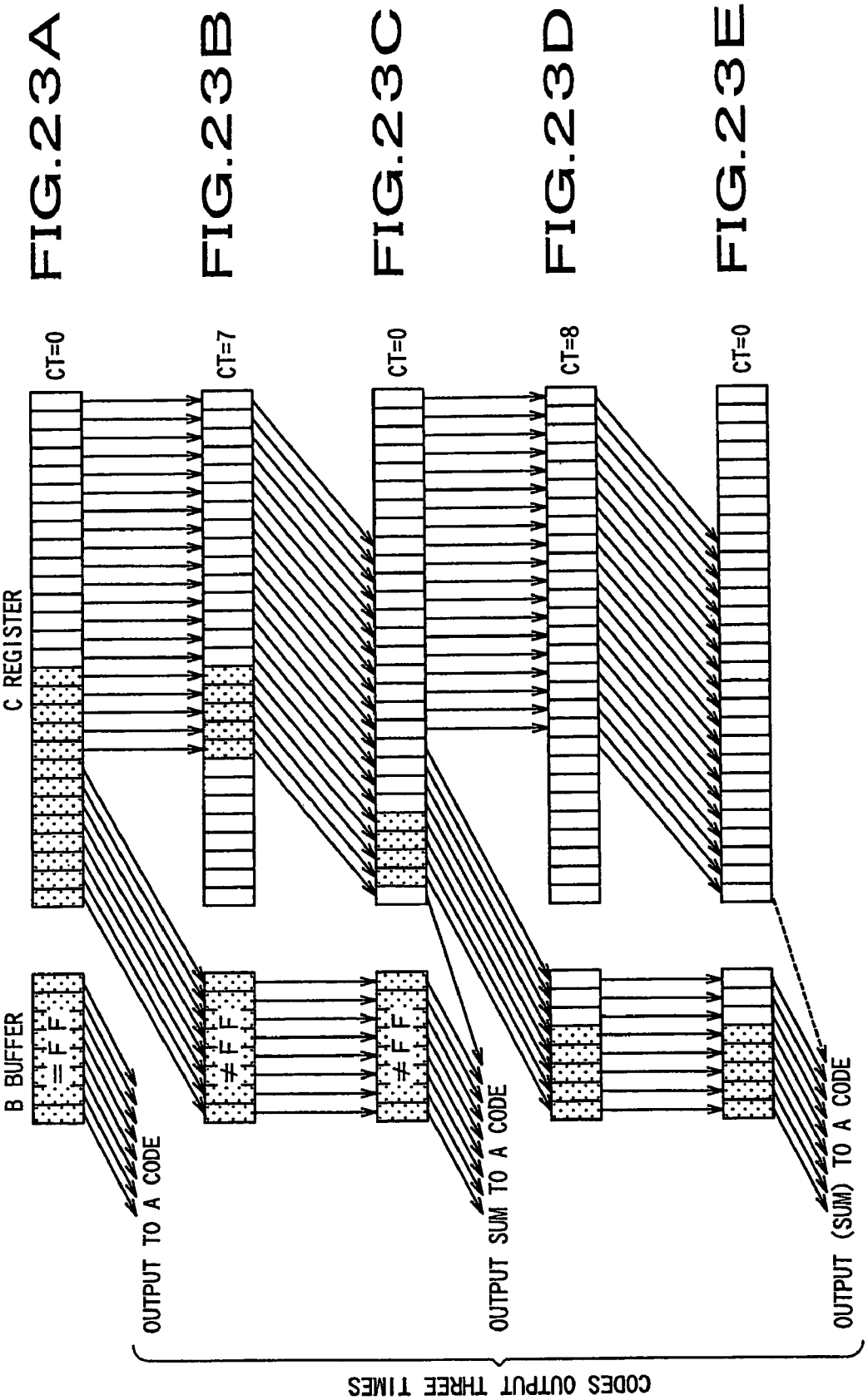
FIGS. 23A-E show an operation until data needed for a code is output as a settled code when the process in FIG. 21 may be applied.

With reference to FIG. 23, the following describes an example where the B buffer contains FF and the process shown in FIG. 21 is applied. State (a) illustrates the B buffer and the C register when the coding pass has completed the last arithmetic coding. Applying the process shown in FIG. 21 enables state (b). The first code byte is settled and is output The C register is then left-shifted seven times until CT is reset to 0 to enable state (c). The JPEG-2000 standard is characterized in that the B buffer does not contain successive FF values. Accordingly, the B buffer does not contain value FF in state (c). Then, applying the process shown in FIG. 20 enables state (d). The second code byte is settled and is output The C register is left-shifted eight times until CT is reset to 0 to enable state (e). In state (e), data needed for the code remains in the B buffer only. Accordingly, the third operation to settle and output the code byte outputs all data needed for the code. In this manner, the code amount of the coding pass at this time is also equivalent to 3 added to the code amount settled to be output when the coding pass has completed the last arithmetic coding.

Though not shown, the same applies to a case where the B buffer is set to FF at a different timing. That is to say, when the coding pass is not terminated, the code amount of the coding pass is equivalent to 3 added to the code amount settled to be output upon termination of the last arithmetic coding in the coding pass.

The arithmetic coding section 16 in FIG. 1 uses the above-mentioned calculation method of the code amount for the coding pass to find code amounts for the coding pass and bit planes even if the coding pass is not terminated.

When the coding pass is not terminated, the last part of the code representing the coding pass is unsettled. The value varies with data for the next coding pass. However, according to the embodiment, the characteristic that it just needs to provide the code amount enough to output the bit at x1 in the C register as shown in FIG. 19 is used to find the code amount before encoding of the next coding pass starts. Therefore, according to the embodiment, it is possible to find the code amount for each coding pass before the EBCOT 17 encodes the succeeding coding pass. Consequently, it is possible to efficiently accumulate code amounts by concurrently performing the EBCOT encoding and, the moment the targeted code amount is reached, omit the remaining coding sequences to fast complete the coding.

(2-2-2) Modification

When the coding pass is not terminated, the above-mentioned example settles output of a code amount assumed to be L upon termination of the last arithmetic coding in that coding pass. In this case, the code amount of the coding pass is calculated as L plus 3 irrespectively of CT counter values. Further, CT counter values may be taken into consideration. It may be preferable to calculate L+2 with the CT counter value set to greater than or equal to 5, and calculate L+3 with the CT counter value set to smaller than 5.

In this manner, the number of code amounts can be smaller than the above-mentioned example. It is possible to improve the compression efficiency. However, there occurs an overhead to reference the CT counter value and change values. To minimize processes, the above-mentioned technique is recommended.

Figure 24:
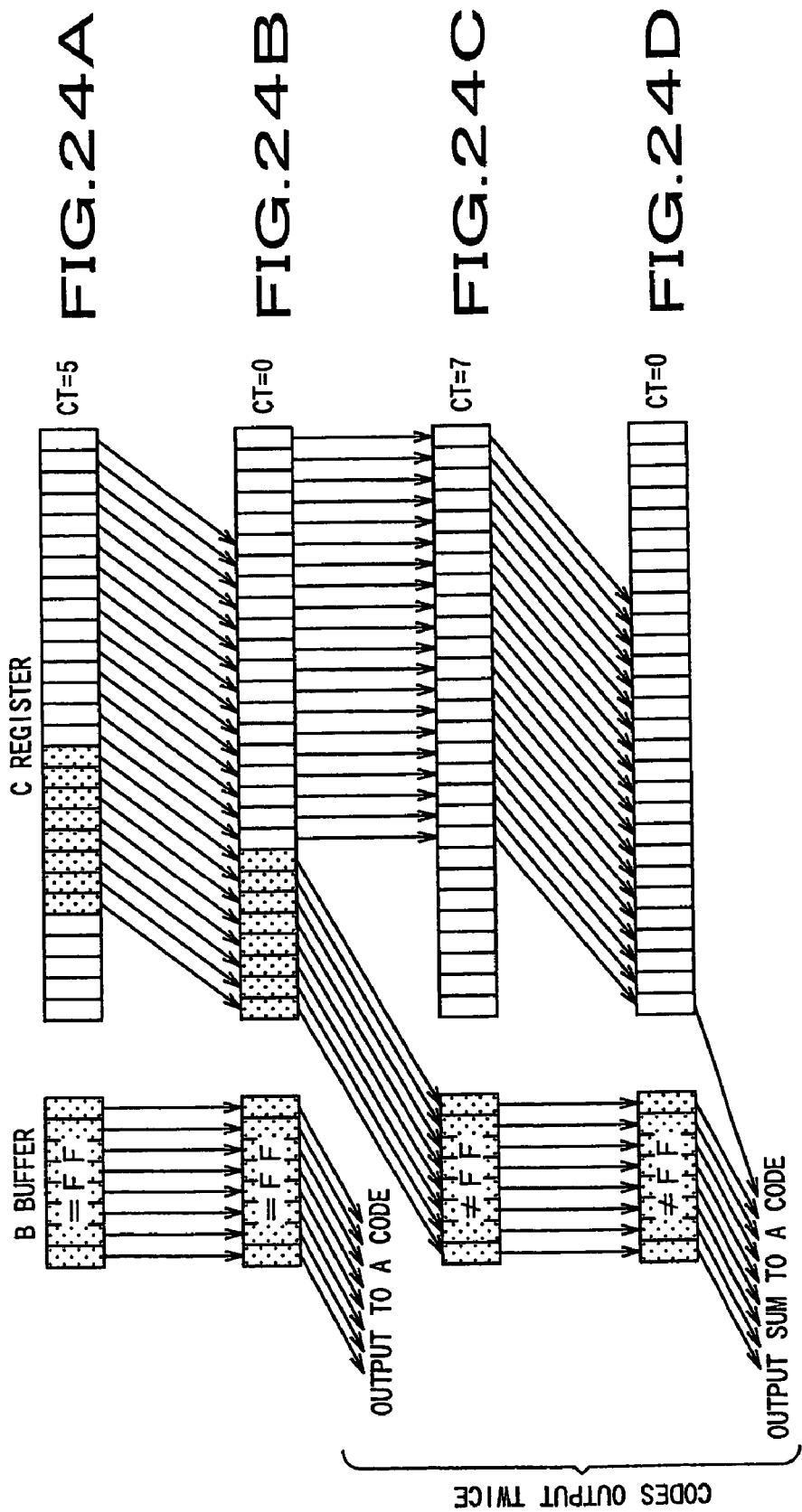
FIGS. 24A-D show an operation until data needed for a code is output as a settled code when a CT counter contains value 5.

The following describes validity of this calculation method. State (a) in FIG. 24 illustrates the B buffer and the C register when the coding pass has completed the last arithmetic coding. Since the CT counter value is set to 5 at this time, the C register can be left-shifted another five times without overflow. State (b) illustrates the B buffer and the C register after the C register is shifted. At this time, the B buffer contains FF. Applying the process shown in FIG. 21 enables state (c). The first code byte is settled and is output. The C register is then left-shifted seven times until CT is reset to 0 to enable state (d). In state (d), data needed for the code remains in the B buffer only. Accordingly, the second operation to settle and output the code byte outputs all data needed for the code. In this manner, when the CT counter value is set to 5 the code amount of the coding pass is equivalent to 2 added to the code amount settled to be output when the coding pass has completed the last arithmetic coding.

When the CT counter value exceeds 5, all data needed for the code can be output by twice performing the operation to settle and output the code byte. The same applies when the B buffer does not contain FF. That is to say, when the coding pass is not terminated, a code amount settled to be output is assumed to be L upon termination of the last arithmetic coding in that coding pass. In this case, the code amount of the coding pass becomes L+2 with the CT counter value set to greater than or equal to 5, and becomes L+3 with the CT counter value set to smaller than 5.

(2-3) Operations of the Quantization Section

As mentioned above, the quantization section 12 is supplied with the wavelet transform coefficient D12 from the wavelet transform section 11. The quantization section 12 then applies lossy compression to the supplied wavelet transform coefficient D12 according to the scalar quantization that uses a quantization step size for division.

The quantization specified in the JPEG-2000 standard calculates quantization coefficient $Q_b(x,y)$ as shown in the following equation (1). That is to say, given transform coefficient $a_b(x,y)$ is divided by quantization step size $\Delta W_b$ of subband b, where x is the horizontal position and y the vertical position.

[Equation 1]

$$Q_b(x,y)=\text{sign}(a_b(x,y))\times |a_b(x,y)|/\Delta W_b \qquad (1)$$

The following equation (2) can be used to find $\Delta W_b$ in equation (1). In equation (2), $\Delta B$-step denotes the basic step size common to all subbands; L2b denotes the L2 norm of a synthesis filter base waveform for subband b; and $\Delta Nb$ denotes the normalized quantization step size of subband b.

[Equation 2]

$$\Delta W_b = \Delta B\text{-Step}/L2_b = \Delta N_b \qquad (2)$$

After $\Delta W_b$ is calculated, the following equation (3) is used to find index $\epsilon_b$ and mantissa $\mu_b$. In equation (3), $R_b$ denotes the dynamic range in subband b. These values $\epsilon_b$ and $\mu_b$ are to be actually contained in a final encoded code stream.

[Equation 3]

$$\Delta W_b = 2^{Rb-\epsilon b}(1+(\mu_b/2^{11})) \qquad (3)$$

To find quantization step size $\Delta W_b$, the quantization section 12 according to the embodiment uses the following equation (4) instead of the above-mentioned equation (2). Equation (4) uses weight coefficient $VW_b$ for each subband b.

[Equation 4]

$$\Delta W_b = (\Delta B\text{-Step}/L2_b)/VW_b = \Delta N_b/VW_b \qquad (4)$$

Weight coefficient $VW_b$ can be specified for each subband or each of components such as Y (brightness), Cb and Cr (color differences). Weight coefficients are stored in a weight coefficient table. Increasing the weight coefficient value decreases $\Delta W_b$ according to equation (4) and increases quantization coefficient $Q_b(x,y)$ according to equation (1). It is preferable to increase values for lower frequencies where important parts of an image concentrate. In addition, visual characteristics of human being are generally more sensitive to brightness information (Y) than to color difference information (Cb, Cr). Accordingly, it is preferable to increase values for brightness information (Y).

FIG. 25 shows an example of the weight coefficient table when the wavelet transform and decomposition is performed five times. As shown in FIG. 25, lower frequencies having smaller decomposition levels indicate larger values. The brightness information (Y) indicates larger values than the color difference information (Cb, Cr).

The subsequent code blocking section 13 divides the quantization coefficient D13 generated by the quantization section 12 into code blocks each having a specified size. The bit plane decomposition section 14 decomposes the quantization coefficient D14 for each code block into bit planes. Larger quantization coefficient values cause more bit planes. As mentioned above, the code amount adding section 18 and the control section 19 select arithmetic codes for each bit plane or coding pass sequentially from the arithmetic code at the highest bit position to the one at the lowest bit position in all code blocks. In this case, an encoded code stream can contain more important information by preference. As a result, it is possible to provide a high quality encoded image.

While there has been described the best mode for carrying out the invention, the present invention is not limited to the above-mentioned embodiment. It is further understood by those skilled in the art that various changes and modifications may be made in the present invention without departing from the spirit and scope thereof.

For example, there has been described the above-mentioned embodiment that provides code amount control for each bit plane. However, the present invention is not limited thereto. It may be preferable to provide code amount control for each coding pass. In this case, the arithmetic coding is performed for each coding pass according to the above-mentioned priorities. The accumulated code amount is compared to the targeted code amount each time one coding pass is arithmetically coded. The next coding pass is arithmetically coded only when the accumulated value is smaller than or equal to the targeted code amount When an input image is encoded according to JPEG-2000, for example, the present invention can omit EBCOT processes subject to high calculation load from finally truncated bit planes. This makes it possible to fast complete the encoding. The small calculation amount can realize energy saving. Further, the encoding progresses from highly prioritized bit planes that have significant effect on the image quality. Accordingly, the same code amount can maintain high image quality.

What is claimed is:

1. An image encoding apparatus comprising:

filtering means for hierarchically applying a filtering process to an input image to generate a plurality of subbands;

code block generation means for dividing the subbands generated by the filtering means to generate a plurality of code blocks each having a specified size;

bit plane generation means for generating a plurality of bit planes from the highest bit to the lowest bit in units of the code blocks;

bit modeling means for applying bit modeling to the plurality of bit planes generated by the bit plane generation means so as to traverse all code blocks from a bit plane having the highest bit position to a bit plane having the lowest bit position;

coding pass generation means for generating a coding pass for each bit plane where the bit modeling is performed;

encoding means for arithmetically encoding the coding pass generated by the coding pass generation means;

code amount control means for controlling code amounts so as to reach a specified targeted code amount based on an arithmetic code generated by the encoding means; and packet generation means for generating a packet by attaching a header to an encoded code stream whose code amount is controlled by the code amount control means, wherein the code amount control means accumulates code amounts of arithmetic codes generated upon termination of arithmetic coding for each coding pass or a coding pass included in each bit plane and controls the encoding means so as to arithmetically encode the next coding pass when an accumulated value is smaller than or equal to the specified targeted code amount or so as to stop arithmetic coding when the accumulated value exceeds the specified targeted code amount.

2. The image encoding apparatus according to claim 1, wherein the bit modeling means performs the bit modeling for the bit planes at the same bit position from the lowest subband to the highest subband in order.

3. The image encoding apparatus according to claim 1, wherein the bit modeling means performs the bit modeling for the bit planes at the same bit position from a brightness component to a color difference component in order.

4. The image encoding apparatus according to claim 1, wherein, when the accumulated value exceeds the specified targeted code amount, the code amount control means allows the encoded code stream to include an arithmetic code up to a coding pass or a bit plane immediately before the specified targeted code amount is exceeded.

5. The image encoding apparatus according to claim 1, further comprising:
   layer division means for dividing all bit planes in all code blocks into a plurality of layers along a direction from the bit plane having the highest bit position to the bit plane having the lowest bit position,
   wherein the code amount control means accumulates code amounts of arithmetic codes generated upon termination of arithmetic coding for each coding pass or a coding pass included in each bit plane, controls the encoding means so as to arithmetically encode the next coding pass in the layer when an accumulated value is smaller than or equal to a targeted code amount for each layer, controls the encoding means so as to arithmetically encode the first coding pass in the next layer when the accumulated value exceeds a targeted code amount for the layer, and controls the encoding means so as to stop arithmetic coding when the accumulated value exceeds the specified targeted code amount.

6. The image encoding apparatus according to claim 1, wherein the apparatus encodes the input image according to JPEG-2000; and
   the code amount control means finds a code amount of an unterminated coding pass to be L+3, where L denotes a code amount settled to be output upon termination of the last arithmetic coding in that coding pass.

7. The image encoding apparatus according to claim 1, wherein the apparatus encodes the input image according to JPEG-2000; and
   the code amount control means finds a code amount of an unterminated coding pass to be L+2 when a value greater than or equal to 5 is placed in a CT counter to count the number of times a C register is shifted toward left bits during calculation of arithmetic codes, or to be L+3 when a value smaller than 5 is placed in the CT counter, where L denotes a code amount settled to be output upon termination of the last arithmetic coding in that coding pass.

8. An image encoding method comprising:
   a filtering step of hierarchically applying a filtering process to an input image to generate a plurality of subbands;
   a code block generation step of dividing the subbands generated by the filtering step to generate a plurality of code blocks each having a specified size;
   a bit plane generation step of generating a plurality of bit planes from the highest bit to the lowest bit in units of the code blocks;
   a bit modeling step of applying bit modeling to the plurality of bit planes generated by the bit plane generation step so as to traverse all code blocks from a bit plane having the highest bit position to a bit plane having the lowest bit position;
   a coding pass generation step of generating a coding pass for each bit plane where the bit modeling is performed;
   an encoding step of arithmetically encoding the coding pass generated by the coding pass generation step;
   a code amount control step of controlling code amounts so as to reach a specified targeted code amount based on an arithmetic code generated by the encoding step; and
   a packet generation step of generating a packet by attaching a header to an encoded code stream whose code amount is controlled by the code amount control step,
   wherein the code amount control step accumulates code amounts of arithmetic codes generated upon termination of arithmetic coding for each coding pass or a coding pass included in each bit plane and controls the encoding step so as to arithmetically encode the next coding pass when an accumulated value is smaller than or equal to the specified targeted code amount or so as to stop arithmetic coding when the accumulated value exceeds the specified targeted code amount.

9. The image encoding method according to claim 8, wherein the bit modeling step performs the bit modeling for the bit planes at the same bit position from the lowest subband to the highest subband in order.

10. The image encoding method according to claim 8, wherein the bit modeling step performs the bit modeling for the bit planes at the same bit position from a brightness component to a color difference component in order.

11. The image encoding method according to claim 8, wherein, when the accumulated value exceeds the specified targeted code amount, the code amount control step allows the encoded code stream to include an arithmetic code up to a coding pass or a bit plane immediately before the specified targeted code amount is exceeded.

12. The image encoding method according to claim 8, further comprising a layer division step of dividing all bit planes in all code blocks into a plurality of layers along a direction from the bit plane having the highest bit position to the bit plane having the lowest bit position,
   wherein the code amount control step accumulates code amounts of arithmetic codes generated upon termination of arithmetic coding for each coding pass or a coding pass included in each bit plane, controls the encoding step so as to arithmetically encode the next coding pass in the layer when an accumulated value is smaller than or equal to a targeted code amount for each layer, controls the encoding step so as to arithmetically encode the first coding pass in the next layer when the accumulated value exceeds a targeted code amount for the layer, and control the encoding step so as to stop arithmetic coding when the accumulated value exceeds the specified targeted code amount.

13. The image encoding method according to claim 8, wherein the method encodes the input image according to JPEG-2000; and
   the code amount control step finds a code amount of an unterminated coding pass to be L+3, where L denotes a code amount settled to be output upon termination of the last arithmetic coding in that coding pass.

14. The image encoding method according to claim 8, wherein the method encodes the input image according to JPEG-2000; and
   the code amount control step finds a code amount of an unterminated coding pass to be L+2 when a value greater than or equal to 5 is placed in a CT counter to count the number of times a C register is shifted toward left bits during calculation of arithmetic codes, or to be L+3 when a value smaller than 5 is placed in the CT counter, where L denotes a code amount settled to be output upon termination of the last arithmetic coding in that coding pass.

15. An image encoding apparatus comprising:
filtering means for hierarchically applying a filtering process to an input image to generate a plurality of subbands;
quantization means for quantizing a transform coefficient in a subband generated by the filtering means by dividing the transform coefficient by a quantization step size weighted by a weight coefficient specified for the subband;
code block generation means for dividing each of the quantized subbands to generate a plurality of code blocks each having a specified size;
bit plane generation means for generating a plurality of bit planes from the highest bit to the lowest bit in units of the code blocks;
bit modeling means for applying bit modeling to the plurality of bit planes generated by the bit plane generation means so as to traverse all code blocks from a bit plane having the highest bit position to a bit plane having the lowest bit position;
coding pass generation means for generating a coding pass for each bit plane where the bit modeling is performed;
encoding means for arithmetically encoding the coding pass generated by the coding pass generation means;
code amount control means for controlling code amounts so as to reach a specified targeted code amount based on an arithmetic code generated by the encoding means; and
packet generation means for generating a packet by attaching a header to an encoded code stream whose code amount is controlled by the code amount control means,
wherein the code amount control means accumulates code amounts of arithmetic codes generated upon termination of arithmetic coding for each coding pass or a coding pass included in each bit plane and controls the encoding means so as to arithmetically encode the next coding pass when an accumulated value is smaller than or equal to the specified targeted code amount or so as to stop arithmetic coding when the accumulated value exceeds the specified targeted code amount.

16. The image encoding apparatus according to claim 15, wherein the weight coefficient is configured so that the quantization step size decreases for a subband containing low-frequency components.

17. The image encoding apparatus according to claim 15, wherein the weight coefficient is configured so that the quantization step size decreases for brightness components rather than color difference components.

18. The image encoding apparatus according to claim 15, wherein the bit modeling means performs the bit modeling for the bit planes at the same bit position from the lowest subband to the highest subband in order.

19. The image encoding apparatus according to claim 15, wherein the bit modeling means performs the bit modeling for the bit planes at the same bit position from a brightness component to a color difference component in order.

20. An image encoding method comprising:
a filtering step of hierarchically applying a filtering process to an input image to generate a plurality of subbands;
a quantization step of quantizing a transform coefficient in a subband generated by the filtering step by dividing the transform coefficient by a quantization step size weighted by a weight coefficient specified for the subband;
a code block generation step of dividing each of the quantized subbands to generate a plurality of code blocks each having a specified size;
a bit plane generation step of generating a plurality of bit planes from the highest bit to the lowest bit in units of the code blocks;
a bit modeling step of applying bit modeling to the plurality of bit planes generated by the bit plane generation step so as to traverse all code blocks from a bit plane having the highest bit position to a bit plane having the lowest bit position;
a coding pass generation step of generating a coding pass for each bit plane where the bit modeling is performed;
an encoding step of arithmetically encoding the coding pass generated by the coding pass generation step;
a code amount control step of controlling code amounts so as to reach a specified targeted code amount based on an arithmetic code generated by the encoding step; and
a packet generation step of generating a packet by attaching a header to an encoded code stream whose code amount is controlled by the code amount control step,
wherein the code amount control step accumulates code amounts of arithmetic codes generated upon termination of arithmetic coding for each coding pass or a coding pass included in each bit plane and controls the encoding step so as to arithmetically encode the next coding pass when an accumulated value is smaller than or equal to the specified targeted code amount or so as to stop arithmetic coding when the accumulated value exceeds the specified targeted code amount.

21. The image encoding method according to claim 20, wherein the weight coefficient is configured so that the quantization step size decreases for a subband containing low-frequency components.

22. The image encoding method according to claim 20, wherein the weight coefficient is configured so that the quantization step size decreases for brightness components rather than color difference components.

23. The image encoding method according to claim 20, wherein the bit modeling step performs the bit modeling for the bit planes at the same bit position from the lowest subband to the highest subband in order.

24. The image encoding method according to claim 20, wherein the bit modeling step performs the bit modeling for the bit planes at the same bit position from a brightness component to a color difference component in order.

* * * * *